(12) United States Patent
Kanezaki et al.

(10) Patent No.: US 9,338,888 B2
(45) Date of Patent: May 10, 2016

(54) WIRED CIRCUIT BOARD

(71) Applicant: NITTO DENKO CORPORATION, Osaka (JP)

(72) Inventors: Saori Kanezaki, Osaka (JP); Hitoki Kanagawa, Osaka (JP); Yoshito Fujimura, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 95 days.

(21) Appl. No.: 13/826,096

(22) Filed: Mar. 14, 2013

(65) Prior Publication Data
US 2013/0248233 A1 Sep. 26, 2013

Related U.S. Application Data

(60) Provisional application No. 61/688,299, filed on May 11, 2012.

(30) Foreign Application Priority Data

Mar. 23, 2012 (JP) ................................. 2012-067717

(51) Int. Cl.
*H05K 1/16* (2006.01)
*H05K 1/18* (2006.01)
(Continued)

(52) U.S. Cl.
CPC ............... *H05K 1/18* (2013.01); *G11B 5/4873* (2013.01); *G11B 5/5552* (2013.01); *H05K 1/111* (2013.01); *G11B 5/484* (2013.01); *G11B 5/486* (2013.01); *H05K 1/056* (2013.01); *H05K 3/321* (2013.01); *H05K 2201/10083* (2013.01); *Y02P 70/611* (2015.11)

(58) Field of Classification Search
CPC ............. H05K 1/02; H05K 1/18; H05K 3/32; H05K 1/056; H05K 1/111; H05K 2201/10083; H05K 3/321
USPC .............. 174/250, 255, 260–262; 361/679.33, 361/752, 760
See application file for complete search history.

(56) References Cited

U.S. PATENT DOCUMENTS 7,280,319 B1 * 10/2007 McNab ...................... 360/294.4
7,359,158 B2 * 4/2008 Takikawa et al. .......... 360/244.8
(Continued)

FOREIGN PATENT DOCUMENTS

JP  2006-86219 A  3/2006
JP  2010-86649 A  4/2010
(Continued)

OTHER PUBLICATIONS

Notification of Reasons for Refusal issued by the Japanese Office Action on Jul. 7, 2015 in connection with JP 2012-067717.
(Continued)

*Primary Examiner* — Yuriy Semenenko
(74) *Attorney, Agent, or Firm* — Jean C. Edwards, Esq.; Edwards Neils PLLC

(57) ABSTRACT

A wired circuit board includes a wire and a terminal formed continuously to the wire and electrically connected to an electronic element at one surface thereof in a thickness direction. The terminal includes a first contact portion, and a second contact portion provided around the first contact portion to protrude more than the first contact portion toward one side in the thickness direction.

6 Claims, 16 Drawing Sheets

(51) Int. Cl.
*H05K 1/11* (2006.01)
*G11B 5/55* (2006.01)
*H05K 1/05* (2006.01)
*H05K 3/32* (2006.01)
*G11B 5/48* (2006.01)

(56) References Cited

U.S. PATENT DOCUMENTS

| | | | |
|---|---|---|---|
| 7,440,236 B1* | 10/2008 | Bennin et al. | 360/294.4 |
| 2003/0161073 A1* | 8/2003 | Horie et al. | 360/244.2 |
| 2006/0202357 A1 | 9/2006 | Kanagawa et al. | |
| 2010/0067151 A1* | 3/2010 | Okawara et al. | 360/294 |
| 2011/0292550 A1* | 12/2011 | Fujimoto | 360/246.2 |
| 2012/0014017 A1 | 1/2012 | Ohnuki et al. | |
| 2013/0014976 A1* | 1/2013 | Ishigaki et al. | 174/255 |

FOREIGN PATENT DOCUMENTS

| | | |
|---|---|---|
| JP | 2010-251619 A | 11/2010 |
| JP | 2011-081861 | 4/2011 |
| JP | 2011-082302 | 4/2011 |
| JP | 2012-022756 | 2/2012 |

OTHER PUBLICATIONS

Decision of Refusal issued by the Japanese Patent Office (JPO) on Feb. 16, 2016 in connection with Japanese Patent Application No. 2012-067717.

* cited by examiner

FIG. 1

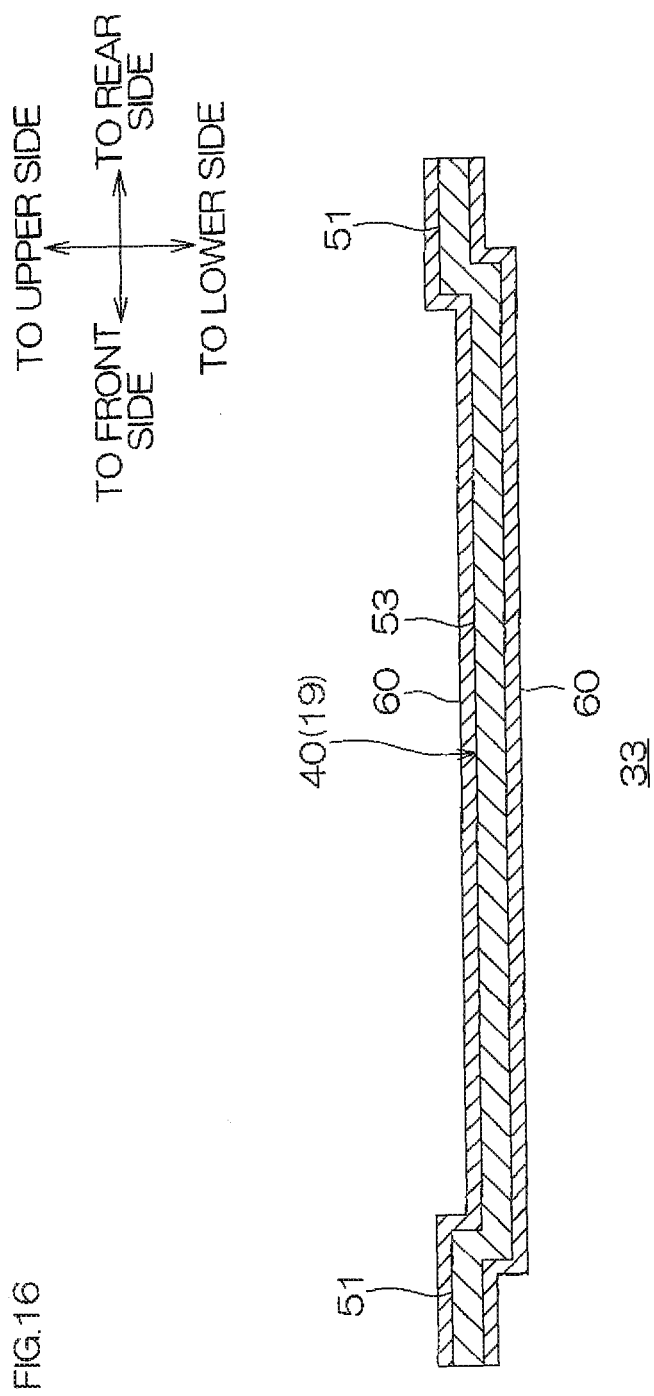

WIRED CIRCUIT BOARD

CROSS-REFERENCE TO RELATED APPLICATION

The present application claims the benefit of U.S. Provisional Patent Applications No. 61/688,299 filed on May 11, 2012, and also claims priority from Japanese Patent Application No. 2012-067717, filed on Mar. 23, 2012, the contents of which are hereby incorporated by reference into this application.

BACKGROUND OF THE INVENTION

1. Field of the Invention

The present invention relates to a wired circuit board, and particularly to a wired circuit board used appropriately for a suspension board with circuit which is mounted in a hard disk drive.

2. Description of the Related Art

A suspension board with circuit includes a metal supporting board, an insulating base layer formed thereon, and a conductive layer formed thereon and having head-side terminals for connecting to a magnetic head. On the suspension board with circuit, the magnetic head is mounted and connected to the head-side terminals. With the metal supporting board being supported on a load beam, the suspension board with circuit is mounted in a hard disk drive.

In recent years, it has been examined to connect such a suspension board with circuit to various electronic elements such as, e.g., a piezoelectric element (piezo-element) and accurately and finely adjust the position and angle of a magnetic head. It has been known that, since an electronic element needs to be connected with heating at a relatively low temperature, the suspension board with circuit and the electronic element are connected using a conductive adhesive.

For example, a terminal member is known which includes a wiring portion to be electrically connected to a piezoelectric element, an electrically insulating layer formed thereunder and provided with a through hole for exposing the wiring portion, and a liquid stopping member disposed thereunder and formed in a ring shape around the through hole (see, e.g., Japanese Unexamined Patent Publication No. 2010-086649).

The terminal member and the piezoelectric element are adhesively bonded together after the conductive adhesive is injected into the through hole by bringing the piezoelectric element and the liquid stopping member of the terminal member into face-to-face contact with each other. At this time, the liquid stopping member inhibits the conductive adhesive in the through hole from leaking to the outside.

SUMMARY OF THE INVENTION

However, in the terminal member described in Japanese Unexamined Patent Publication No. 2010-086649 mentioned above, the wiring portion is electrically connected to the piezoelectric element via the conductive adhesive. Accordingly, to improve the reliability of the electrical connection, it is considered to enlarge the through hole and increase the area of the exposed wiring portion. When the through hole is enlarged, the size of the liquid stopping member is also increased accordingly to the increased area of the wiring portion. However, such a size increase is subjected to layout constraints.

It is therefore an object of the present invention to provide a wired circuit board in which it is possible to inhibit a conductive adhesive from leaking to the outside, while inhibiting terminals from being increased m size, and also improve connection reliability.

A wired circuit board of the present invention includes a wire, and a terminal formed continuously to the wire and electrically connected to an electronic element at one surface thereof in a thickness direction, wherein the terminal includes a first contact portion, and a second contact portion provided around the first contact portion to protrude more than the first contact portion toward one side in the thickness direction.

In the wired circuit board of the present invention, it is preferable that the electronic element is a piezoelectric element.

In the wired circuit board of the present invention, it is preferable that the terminal is used to be connected to the electronic element via a conductive adhesive.

It is preferable that the wired circuit board of the present invention further includes a first insulating layer formed on the one side of the terminal in the thickness direction, and the first insulating layer is formed with a first opening exposing the one surface of each of the first contact portion and the second contact portion in the thickness direction.

In the wired circuit board of the present invention, it is preferable that the second contact portion protrudes from the one surface of the first insulating layer in the thickness direction toward the one side in the thickness direction.

It is preferable that the wired circuit board of the present invention further includes a second insulating layer formed on the other side of the terminal in the thickness direction, and the second insulating layer is formed with a second opening exposing the other surface of each of the first contact portion and the second contact portion in the thickness direction.

In the wired circuit board of the present invention, it is preferable that the electronic element is a piezoelectric element.

In the wired circuit board of the present invention, the first contact portion can be connected to the electronic element via a conductive adhesive.

In addition, since the second contact portion is provided around the first contact portion to protrude from the first contact portion toward the one side in the thickness direction, it is possible to inhibit the conductive adhesive from leaking to the outside of the second contact portion using the second contact portion.

Moreover, since the second contact portion protrudes from the first contact portion toward the one side in the thickness direction, the second contact portion can be connected to the electronic element either directly or via the conductive adhesive.

Therefore, it is possible to increase the contact area of the terminal electrically connected to the electronic element without increasing the size of the terminal.

As a result, it is possible to inhibit the conductive adhesive from leaking to the outside of the second contact portion, while inhibiting the terminal from being increased in size, and sufficiently improve the reliability of the electrical connection between the terminal and the electronic element.

BRIEF DESCRIPTION OF THE DRAWINGS

FIG. 1 shows a plan view of an assembly including a suspension board with circuit as an embodiment of a wired circuit board of the present invention;

FIG. 16 shows a cross-sectional view of a pad portion (form which does not include either an insulating base layer or an insulating cover layer and is connected to the piezoelectric terminal 34 on the upper side thereof) of a suspension board with circuit as still another embodiment of the wired circuit board of the present invention.

DETAILED DESCRIPTION OF THE INVENTION

Figure 1:
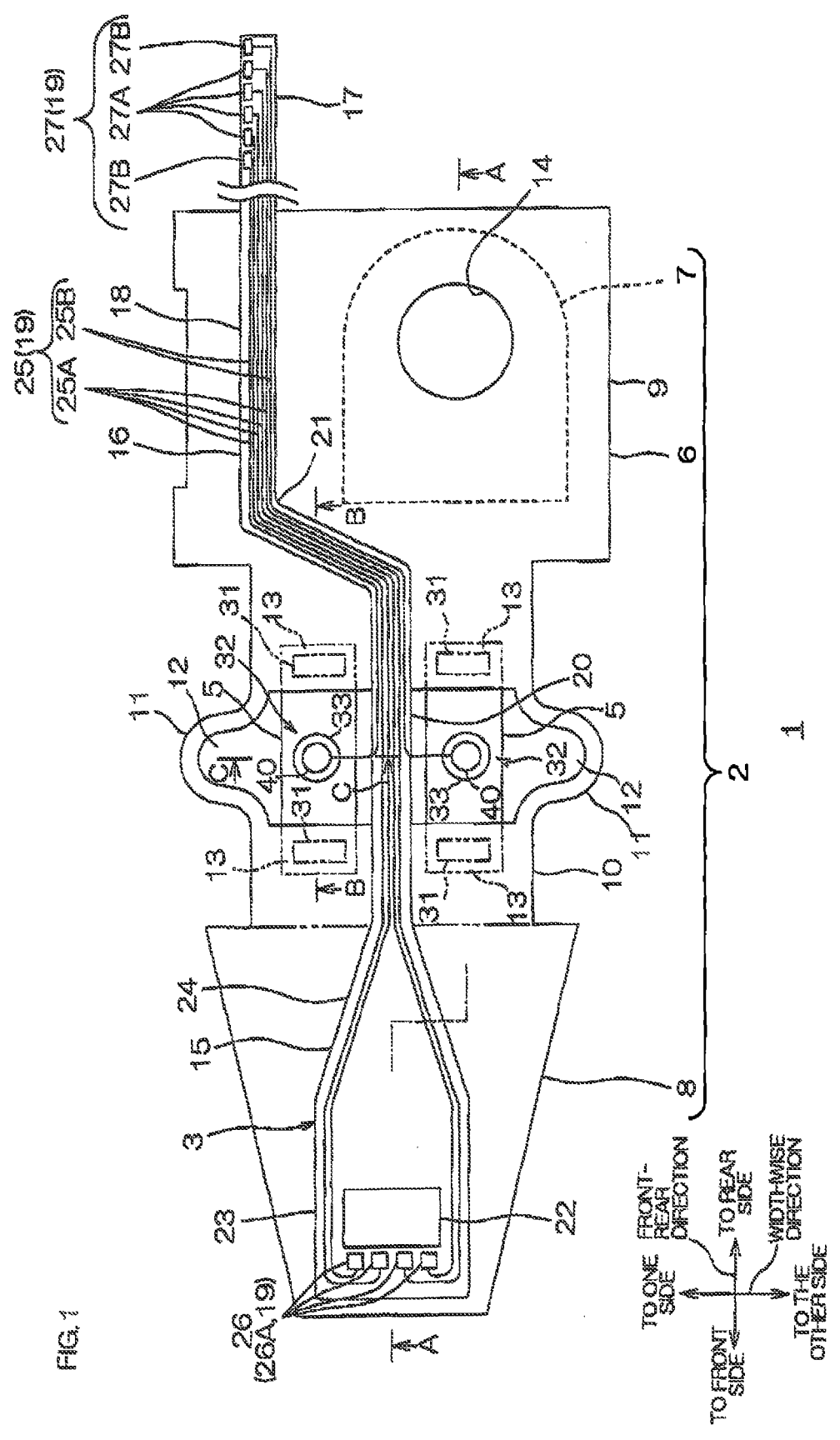
Figure 2:
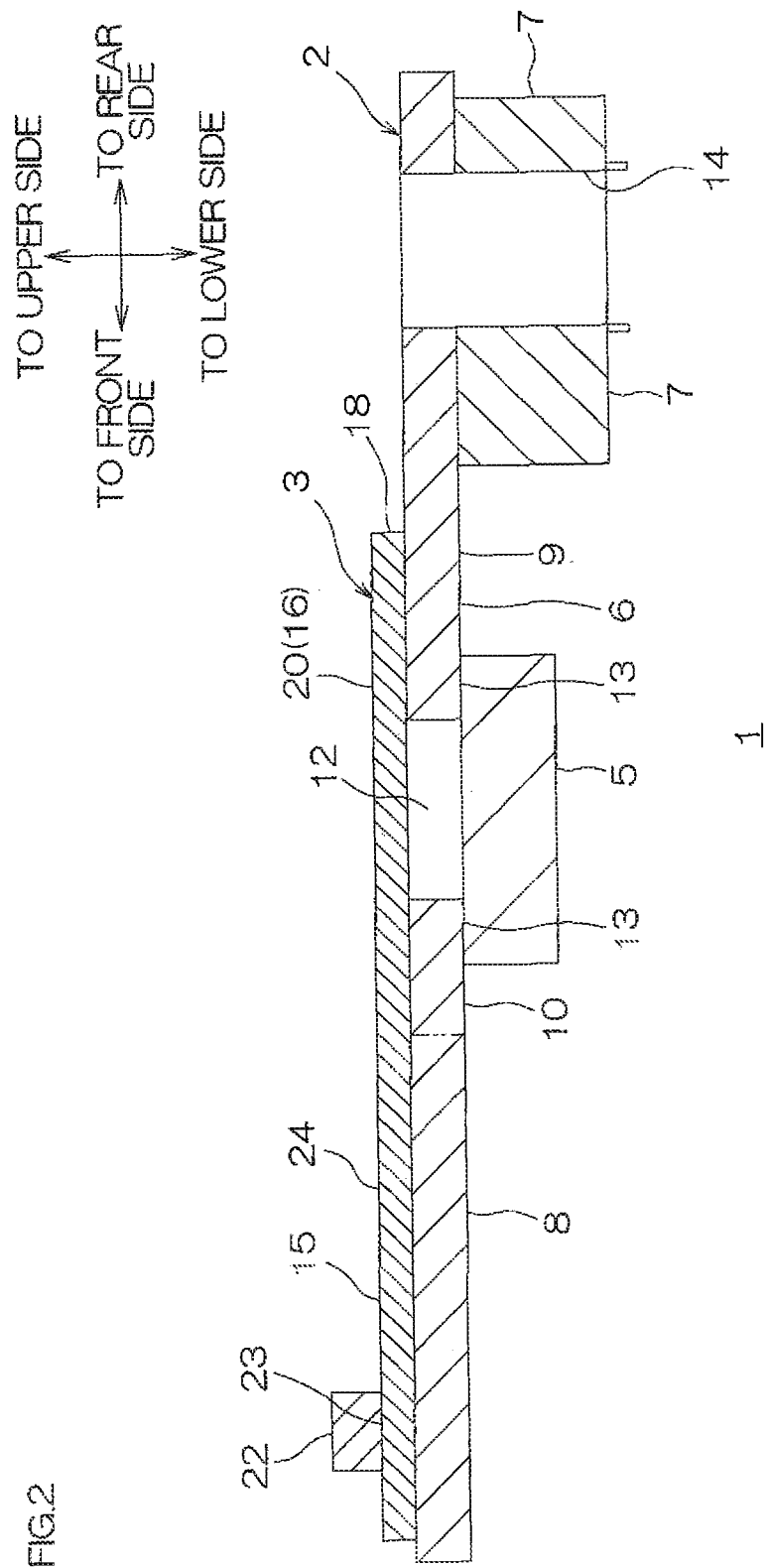
FIG. 2 shows a cross-sectional view of the assembly shown in FIG. 1, which is taken along the line A-A.
Figure 3:
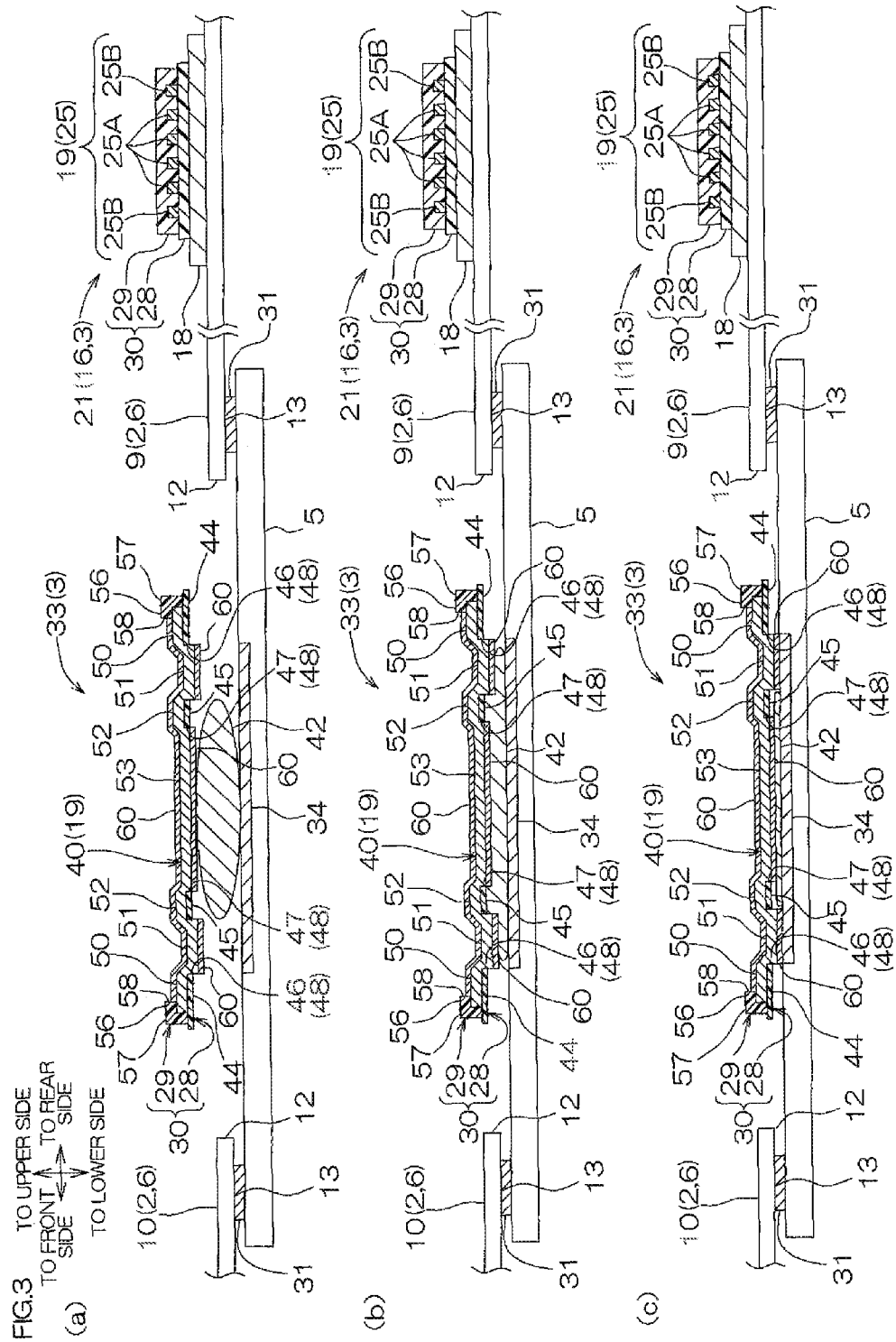
FIG. 3 shows a cross-sectional view of the assembly shown in FIG. 1, which is taken along the line B-B, (a) showing a state in which a conductive adhesive is interposed between a piezoelectric-side terminal and a piezoelectric element, (b) showing a state in which the piezoelectric-side terminal and the piezoelectric element are electrically connected, and an outer contact portion and a piezoelectric terminal are connected via the conductive adhesive, and (c) showing a state in which the piezoelectric-side terminal and the piezoelectric element are electrically connected, and the outer contact portion and the piezoelectric terminal are directly connected.
Figure 4:
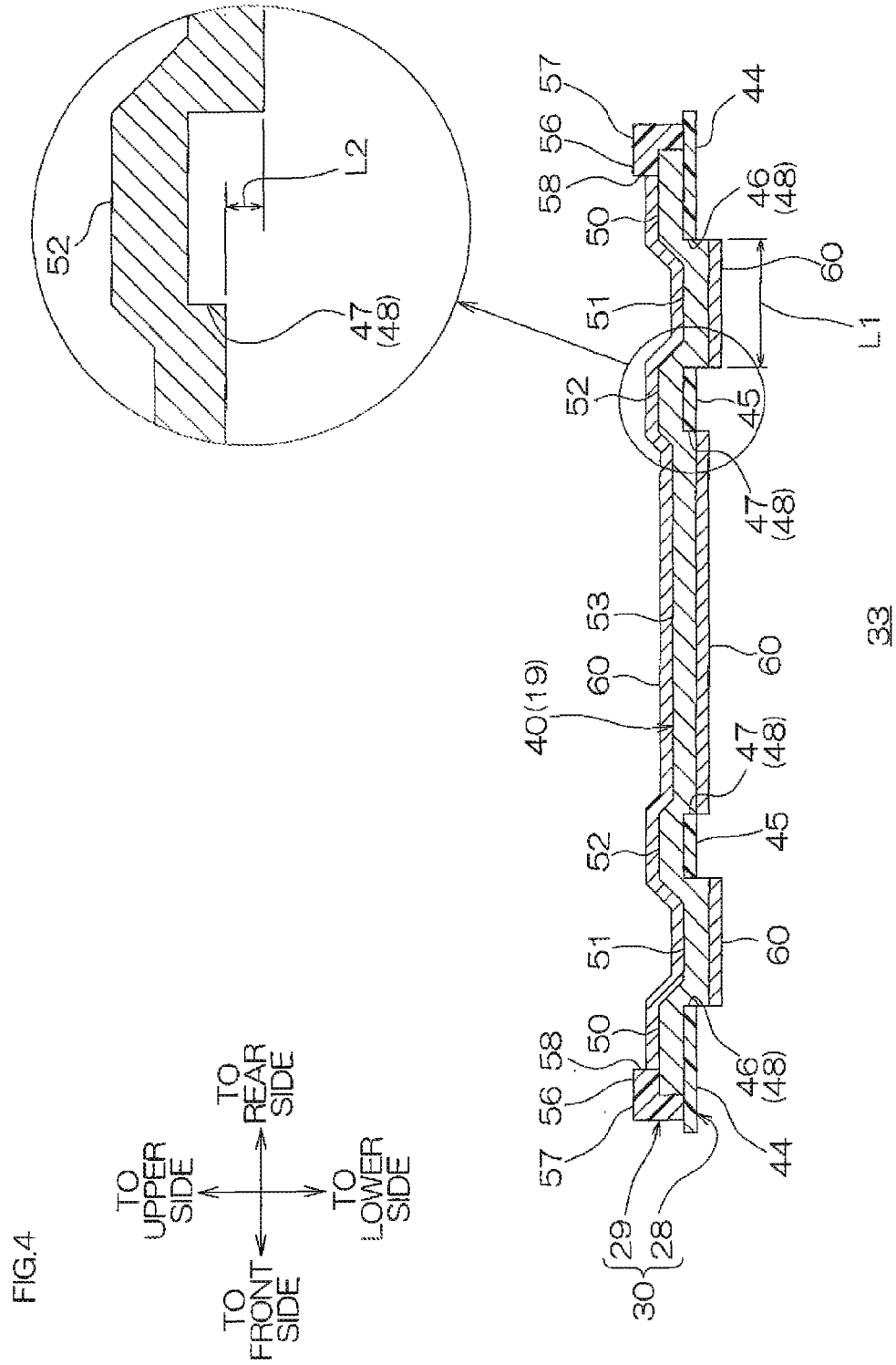
FIG. 4 shows an enlarged cross-sectional view of the piezoelectric-side terminal of the assembly shown in FIG. 3.
Figure 5:
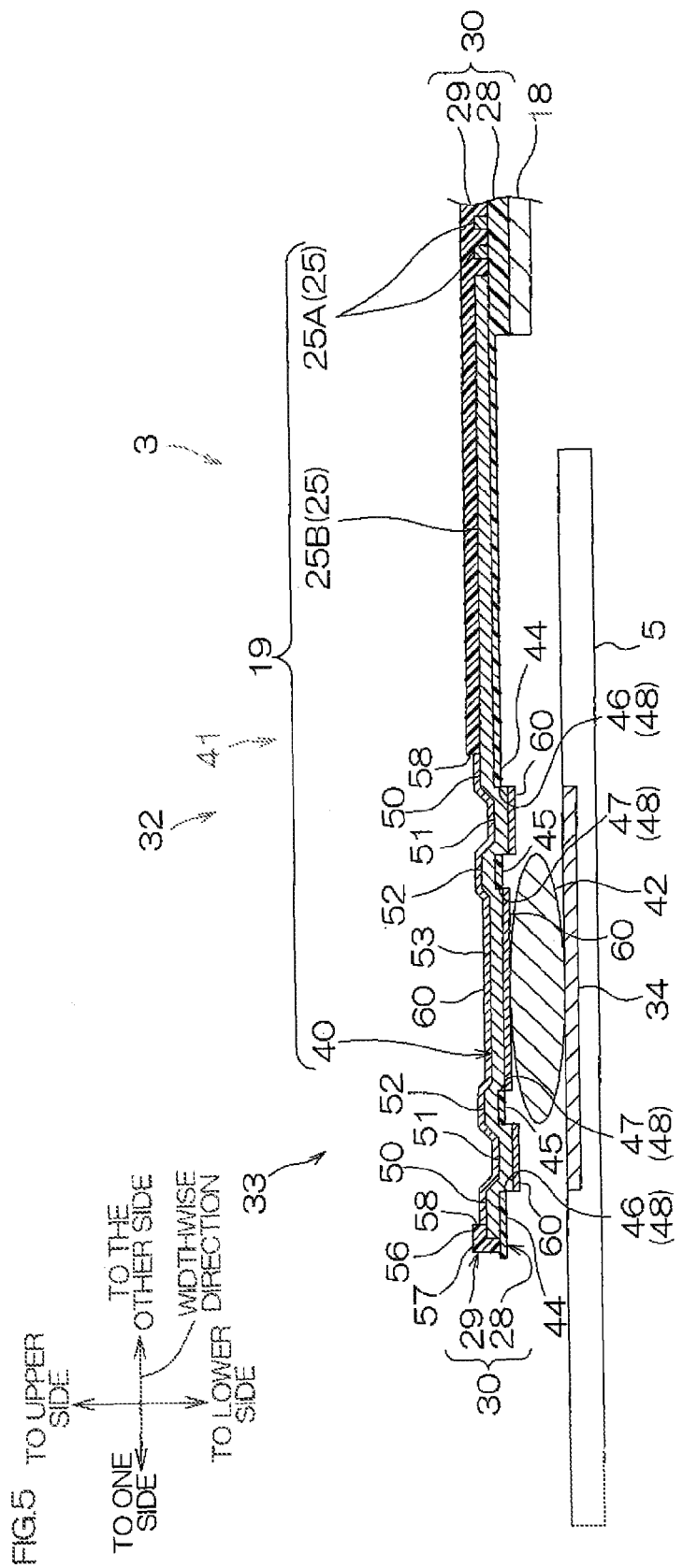
FIG. 5 shows a cross-sectional view of the assembly shown in FIG. 1, which is taken along the line C-C.
Figure 6:
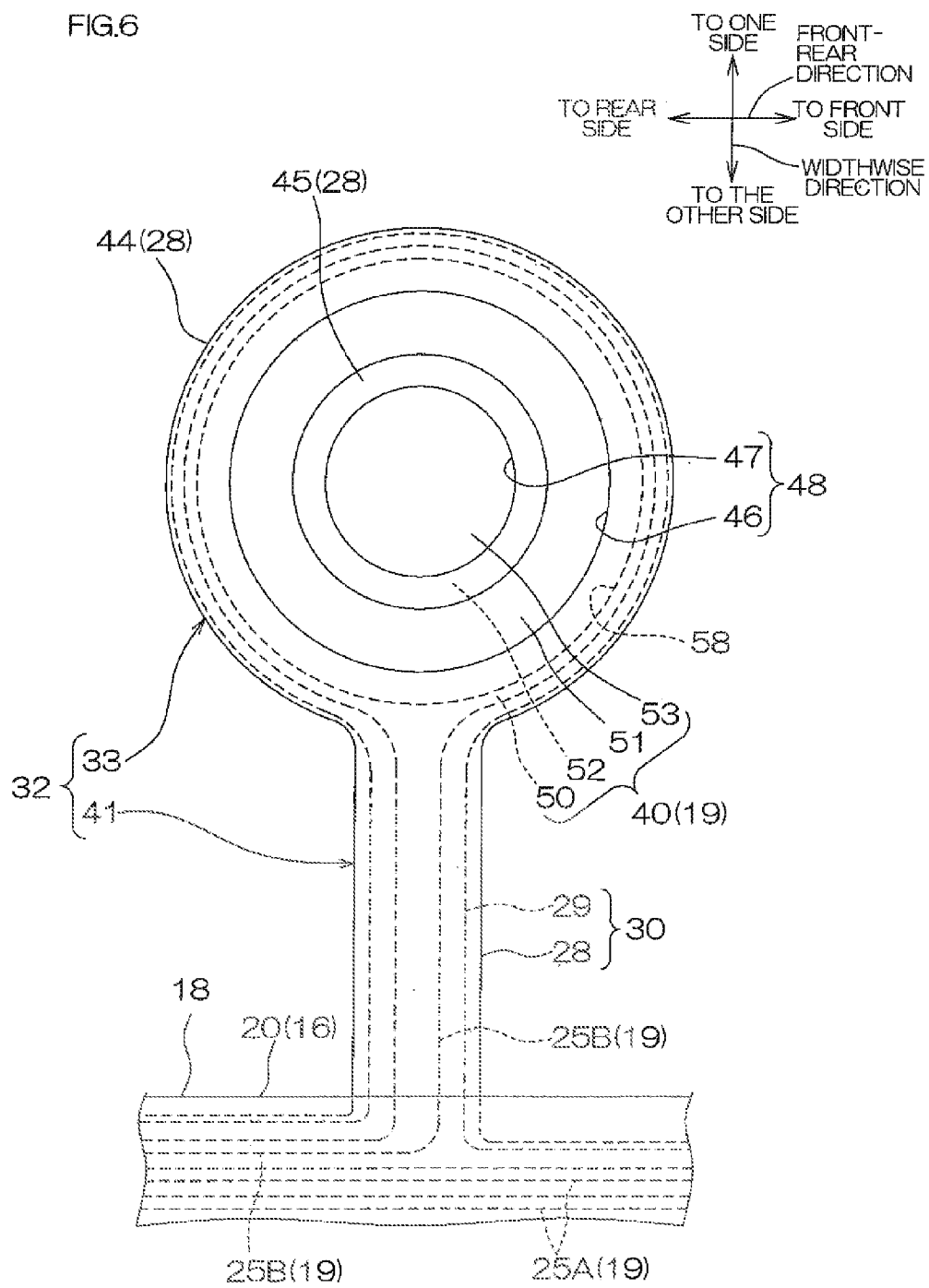
FIG. 6 shows an enlarged bottom view of a connecting arm of the assembly shown in FIG. 1.
Figure 7:
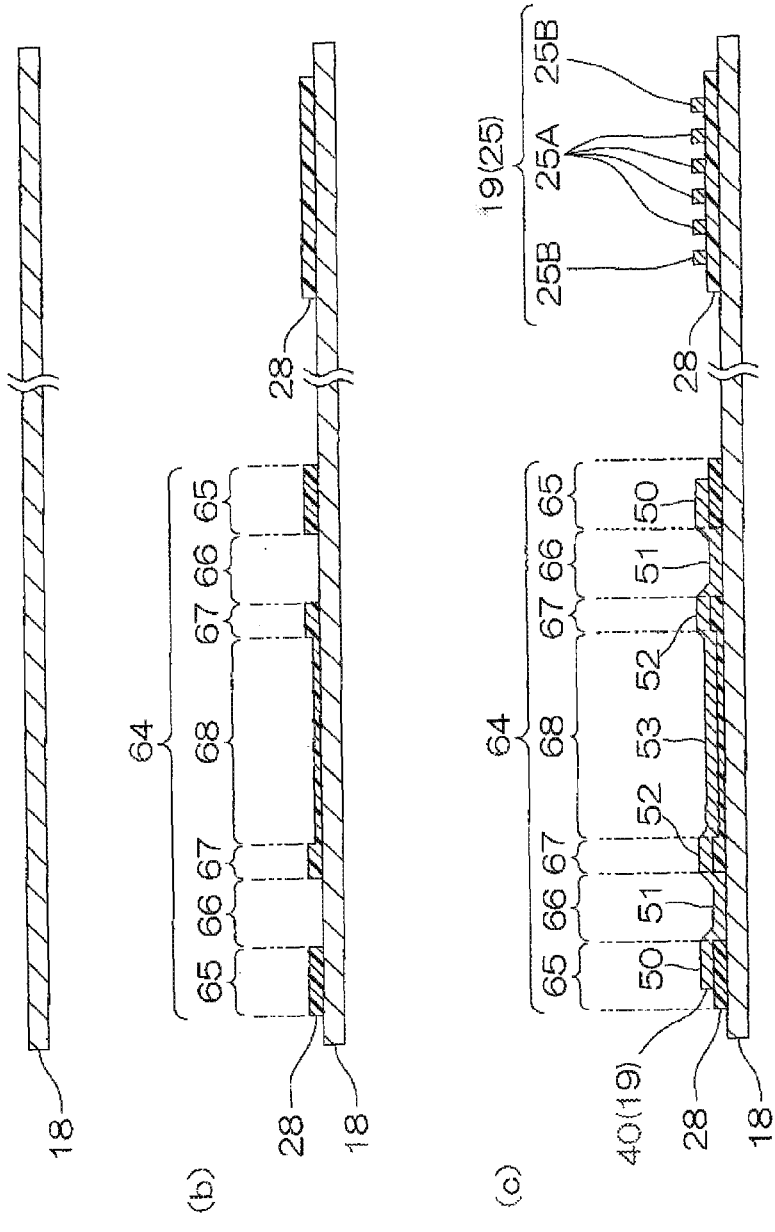
FIG. 7 is a process view illustrating a producing method of the suspension board with circuit, (a) showing the step of preparing a metal supporting board, (b) showing the step of forming an insulating base layer, and (c) showing the step of forming a conductive layer.
Figure 8:
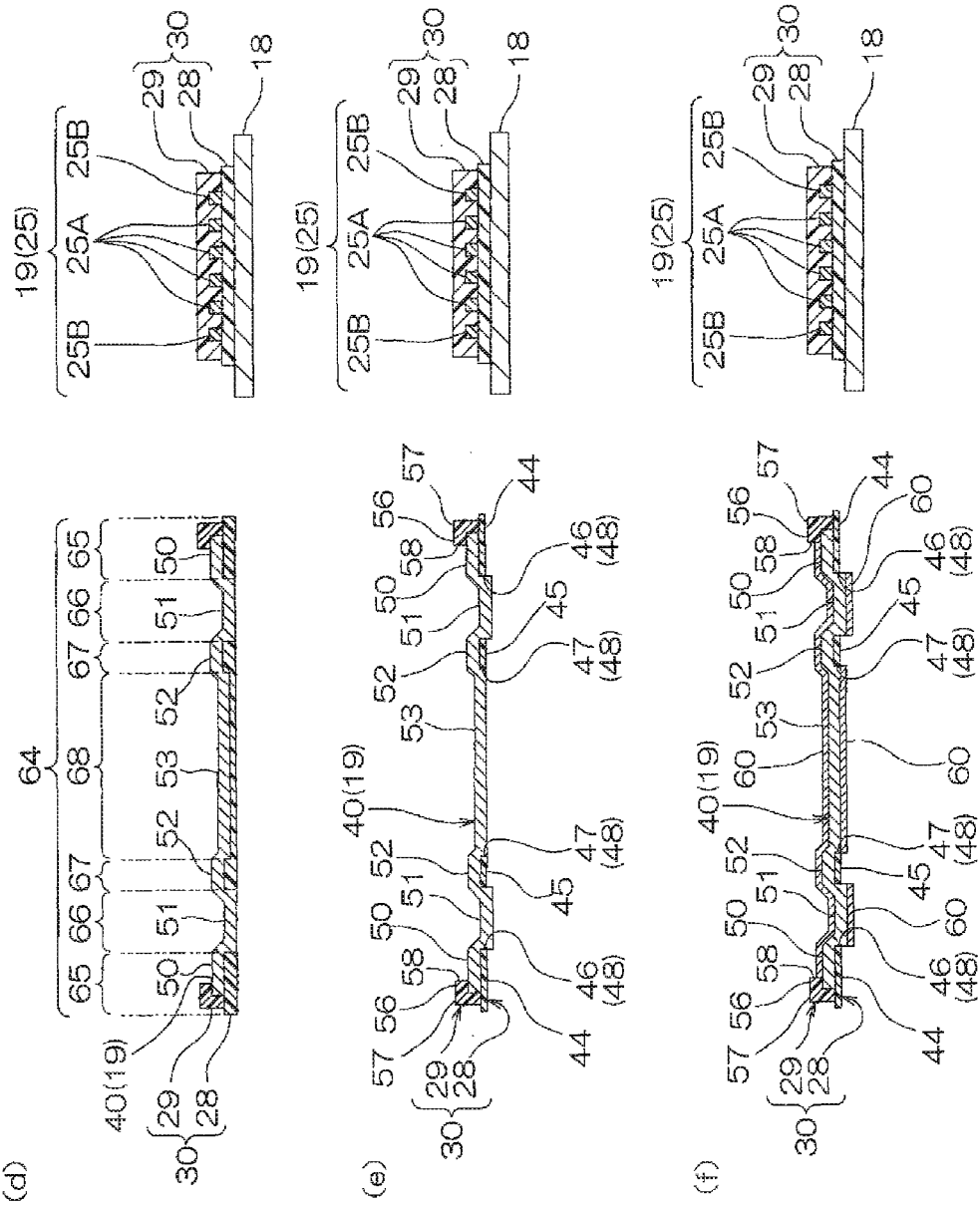
FIG. 8 is a process view illustrating the producing method of the suspension board with circuit, subsequently to FIG. 7, (d) showing the step of removing the metal supporting board to form an outer opening, (e) showing the step of removing the insulating base layer to form an inner opening, and (f) showing the step of forming a protective thin film.

FIG. 1 shows a plan view of an assembly including a suspension board with circuit as an embodiment of a wired circuit board of the present invention. FIG. 2 shows a cross-sectional view of the assembly shown in FIG. 1, which is taken along the line A-A. FIG. 3 shows a cross-sectional view of the assembly shown in FIG. 1, which is taken along the line B-B. FIG. 4 shows an enlarged cross-sectional view of a piezoelectric-side terminal of the assembly shown in FIG. 3. FIG. 5 shows a cross-sectional view of the assembly shown in FIG. 1, which is taken along the line C-C. FIG. 6 shows an enlarged bottom view of a connecting arm of the assembly shown in FIG. 1. FIGS. 7 and 8 are process views illustrating a producing method of the suspension board with circuit.

Note that, in FIG. 1, an insulating base layer 28 and an insulating cover layer 29 are omitted for clear illustration of relative positioning of a metal supporting board 18 and a conductive layer 19.

In FIGS. 1 and 2, an assembly 1 is a head-stack assembly (HSA) to be mounted in a hard disk drive (not shown), in which a suspension board with circuit 3 as an example of the wired circuit board on which a slider 22 mounting thereon a magnetic head (not shown) is mounted is supported on a support plate 2. The assembly 1 includes the support plate 2, the suspension board with circuit 3 disposed on the support plate 2 (on the other side thereof in a thickness direction, which holds true hereinafter) and supported on the support plate 2, and piezoelectric elements (piezo-elements) 5 as electronic elements for accurately and finely adjusting the position and angle of the suspension board with circuit 3, while being supported on the support plate 2.

The support plate 2 is formed so as to extend in a longitudinal direction (front-rear direction), and includes an actuator plate portion 6, a base plate portion 7 formed under the actuator plate portion 6 (on one side thereof in the thickness direction, which holds true hereinafter), and a load beam portion 8 formed continuously to the front side of the actuator plate portion 6.

The actuator plate portion 6 integrally includes a rear plate portion 9, a front plate portion 10 disposed on the front side of the rear plate portion 9 to be spaced apart therefrom, and flexible portions 11 formed between the rear plate portion 9 and the front plate portion 10.

The rear plate portion 9 is formed in a generally rectangular plan view shape in the rear end portion of the actuator plate portion 6.

The front plate portion 10 is formed in a generally rectangular plan view shape extending in a widthwise direction (direction perpendicular to the front-rear direction).

The flexible portions 11 are provided on both widthwise sides of the actuator plate portion 6. The flexible portion 11 on one widthwise side is formed to extend between the front end portion of the rear plate portion 9 and the rear end portion of the front plate portion 10. Also, the flexible portion 11 on the other widthwise side is formed to extend between the front end portion of the rear plate portion 9 and the rear end portion of the front plate portion 10.

The individual flexible portions 11 have respective middle portions thereof in the front-rear direction which are formed to be curved outwardly on both widthwise sides and have generally equal widths throughout the front-rear direction. Specifically, the middle portions of the flexible portions 11 in the front-rear direction are formed so as to outwardly protrude into generally U-shaped (or generally V-shaped) shapes on both widthwise sides.

Accordingly, the flexible portions 11 are formed to be able to bring the front plate portion 10 away from and closer to the rear plate portion 9 due to the extension/contraction of the piezoelectric elements 5, as described later.

The actuator plate portion 6 is also formed with plate openings 12 defined by the front surface of the rear plate portion 9, the rear surface of the front plate portion 10, and the widthwise inner surfaces of the flexible portions 11. The plate openings 12 extend through the actuator plate portion 6 in the thickness direction.

In the front end portion of the rear plate portion 9 and the rear end portion of the front plate portion 10, two pairs of attachment regions 13 to which the rear end portions and front end portions of the piezoelectric elements 5 are respectively attached are defined. The attachment regions 13 are each defined in a widthwise elongated generally rectangular bottom view shape in one widthwise end portion or in the other widthwise end portion to correspond to the front end portion of the rear plate portion 9 and the rear end portion of the front plate portion 10.

The base plate portion 7 is fixed to the middle portion of the lower surface of the rear plate portion 9 in each of the widthwise direction and the front-rear direction. The base plate portion 7 has a front portion thereof formed in a generally rectangular shape and a rear portion thereof formed in a generally semi-circular shape in planar view.

The support plate 2 is formed with a hole 14 having a generally circular bottom view shape and extending through the middle portion of the rear plate portion 9 and the middle portion of the base plate portion 7.

Note that, to the base plate portion 7, a drive coil (not shown) for causing the front end portion of the assembly 1 to swing around the hole 14 is attached.

The load beam portion 8 is integrally formed with the actuator plate portion 6. Specifically, the load beam portion 8 is formed to extend from the front end of the front plate portion 10 toward the front side, and formed in a generally trapezoidal shape which gradually decreases in width with approach to the frontmost portion.

The support plate 2 is formed of a metal material such as, e.g., stainless steel, aluminum, iron, or an alloy thereof.

The size of the support plate 2 is set appropriately. For example, the thickness of each of the actuator plate portion 6 and the load beam portion 8 is in a range of, e.g., 30 to 150 μm, and the thickness of the base plate portion 7 is in a range of, e.g., 150 to 200 μm.

Note that the support plate 2 is provided as an integrated actuator-plate/load-beam plate integrally including the actuator plate portion 6 and the load-beam portion 8.

The suspension board with circuit 3 is formed in a generally flat-belt plan view shape extending in the front-rear direction.

As shown in FIG. 1, the suspension board with circuit 3 includes the metal supporting board 18 and the conductive layer 19 supported on the metal supporting board 18.

The metal supporting board 18 is formed so as to correspond to the outer shape of the suspension board with circuit 3, and integrally includes a wiring portion 16, a front portion 15 formed on the front side of the wiring portion 16, and a rear portion 17 formed on the rear side of the wiring portion 16.

The wiring portion 16 is formed in the middle portion of the metal supporting board 18 in the front-rear direction, and integrally includes a linear portion 20 extending in the front-rear direction, and a bent portion 21 bent on one side in the widthwise direction from the rear end portion of the linear portion 20, and then further bent rearward. Note that the linear portion 20 and the bent portion 21 are formed to have generally equal widths in the front-rear direction.

The wiring portion 16 supports wires 25 (described later).

The front portion 15 is formed in a generally rectangular plan view shape continued from the front end of the linear portion 20, and gradually protruding outward on both widthwise sides from the wiring portion 16. Specifically, the front portion 15 includes a gimbal 23 on which the slider 22 (described later) is mounted, and a gimbal rear portion 24 connecting the gimbal 23 and the linear portion 20.

The gimbal 23 is formed in a generally rectangular plan view shape having a width larger than the width of the linear portion 20. The gimbal 23 supports front-side terminals 26 (described later), while mounting thereon the slider 22 (described later) having the magnetic head (not shown) electrically connected to the front-side terminals 26 (described later).

The gimbal rear portion 24 is formed in a generally triangular shape continued to the rear end of the gimbal 23 and gradually decreasing in width with approach to the rearmost portion. The gimbal rear portion 24 supports the wires 25 (described later).

The rear portion 17 is formed in a generally rectangular plan view shape continued from the rear end of the bent portion 21 and having generally the same width as that of the bent portion 21. The rear portion 17 supports rear-side terminals 27 (described later).

The conductive layer 19 integrally includes the wires 25 extending along the front-rear direction, the front-side terminals 26 continued to the front end portions of the wires 25, and the rear-side terminals 27 continued to the rear end portions of the wires 25 on the metal supporting board 18.

The wires 25 include signal wires 25A each for transmitting an electric signal between the magnetic head (not shown) and a read/write board (not shown), and disposed throughout the front-rear direction of the suspension board with circuit 3. The plurality of (four) signal wires 25A are arranged in widthwise spaced-apart relation.

The wires 25 also include a plurality of (two) power-source wires 25B.

The power-source wires 25B are electrically connected to power-source-side terminals 27B described next. The power-source wires 25B are disposed to be continued to the power-source-side terminals 27B in the rear portion 17, arranged in parallel and spaced-apart relation on both sides of the signal wires 25A in the rear portion 17 and the bent portion 21, and bent outwardly on both widthwise sides in the middle portion of the linear portion 20 in the front-rear direction to reach outer conductive portions 50 of piezoelectric-side terminals 40 (see FIG. 6) described later.

The front-side terminals 26 are disposed on the front portion 15. Specifically, the plurality of (four) front-side terminals 26 are arranged along the front end surface of the slider 22 in widthwise spaced-apart relation on the front side of the gimbal 23.

The front-side terminals 26 are head-side terminals 26A to which the magnetic head (not shown) is electrically connected.

The rear-side terminals 27 are disposed on the rear end portion of the rear portion 17. Specifically, the plurality of (six) rear-side terminals 27 are disposed to be spaced apart from each other in the front-rear direction. The rear-side terminals 27 are continued to the signal wires 25A, and include a plurality of (four) external terminals 27A to which the terminals of the read/write board are connected.

The rear-side terminals 27 also include the plurality of (two) power-source-side terminals 27B continued to the power-source wires 25B and electrically connected to the piezoelectric elements 5. Note that the power-source-side terminals 27B are disposed in spaced-apart relation on both sides of the external terminals 27A in the front-rear direction, and electrically connected to a power source (not shown).

As shown in FIGS. 3 and 5, the suspension board with circuit 3 includes the metal supporting board 18, an insulating layer 30 formed thereon, and the conductive layer 19 covered with the insulating layer 30.

The metal supporting board 18 is formed of a metal material such as, e.g., stainless steel, a 42-alloy, aluminum, a copper-beryllium alloy, or phosphor bronze. Preferably, the metal supporting board 18 is formed of stainless steel. The thickness of the metal supporting board 18 is in a range of, e.g., 15 to 50 μm, or preferably 15 to 20 μm.

The insulating layer 30 includes the insulating base layer 28 as an example of a first insulating layer formed on the upper surface of the metal supporting board 18, and the insulating cover layer 29 as an example of a second insulating layer formed on the insulating base layer 28 so as to cover the wires 25.

As shown in FIG. 1, the insulating base layer 28 is formed in a pattern corresponding to the conductive layer 19 on the upper surface of the metal supporting board 18 in the front portion 15, the wiring portion 16, and the rear portion 17.

The insulating base layer 28 is formed of an insulating material such as a synthetic resin such as, e.g., a polyimide resin, a polyamide imide resin, an acrylic resin, a polyether nitrile resin, a polyether sulfone resin, a polyethylene terephthalate resin, a polyethylene naphthalate resin, or a polyvinyl chloride resin. Preferably, the insulating base layer 28 is formed of a polyimide resin.

The thickness (maximum thickness) of the insulating base layer 28 is in a range of, e.g., 1 to 35 μm, or preferably 8 to 15 μm.

The insulating cover layer 29 is formed over the wiring portion 16, the front portion 15, and the rear portion 17 so as to cover the upper surface of the insulating base layer 28 exposed from the wires 25 and the upper surface and side surfaces of the wires 25. The insulating cover layer 29 is also formed in a pattern exposing the front-side terminals 26 in the front portion 15 and exposing the rear-side terminals 27 in the rear portion 17.

The insulating cover layer 29 is formed of the same insulating material as the insulating material of the insulating base layer 28. The thickness of the insulating cover layer 29 is in a range of, e.g., 1 to 40 μm, or preferably 1 to 10 μm.

As shown in FIGS. 1 and 3, the conductive layer 19 is formed in the foregoing pattern over the upper surface of the insulating base layer 28 in the front portion 15, the wiring portion 16, and the rear portion 17.

The conductive layer 19 is formed of a conductive material such as, e.g., copper, nickel, gold, a solder, or an alloy thereof. Preferably, the conductive layer 19 is formed of copper.

The thickness of the conductive layer 19 is in a range of, e.g., 3 to 50 μm, or preferably 5 to 20 μm.

The width of each of the wires 25 is in a range of, e.g., 5 to 200 μm, or preferably 8 to 100 μm. The spacing between the individual wires 25 is in a range of, e.g., 5 to 1000 μm, or preferably 8 to 100 μm.

The widths and lengths of the front-side terminals 26 and the rear-side terminals 27 are in a range of, e.g., 20 to 1000 μm, or preferably 30 to 800 μm. The spacing between the individual front-side terminals 26 and the spacing between the individual rear-side terminals 27 are in a range of, e.g., 20 to 1000 μm, or preferably 30 to 800 μm.

In the suspension board with circuit 3, as shown in FIGS. 1 and 2, the lower surface of the metal supporting board 18 is supported on the support plate 2. Specifically, the lower surfaces of the wiring portion 16 and the front portion 15 are supported on the support plate 2, while the lower surface of the rear portion 17 protrudes rearward from the support plate 2 without being supported on the support plate 2.

Specifically, in the suspension board with circuit 3, the bent portion 21 is disposed in a generally L-shaped shape along the one widthwise end portion of the rear plate portion 9 and the front end portion thereof, and the linear portion 20 is disposed to extend from the widthwise middle portion of the front end portion of the rear plate portion 9, traverse the widthwise middle portion between the plate openings 12, and then reach the widthwise middle portion of the front plate portion 10. Also, in the suspension board with circuit 3, the front portion 15 is disposed to be formed on the widthwise middle portion of the load beam portion 8 to extend throughout the front-rear direction of the load beam portion 8.

The piezoelectric elements 5 are attached to the lower side of the support plate 2.

Specifically, the plurality of (two) piezoelectric elements 5 are provided in widthwise spaced-apart relation.

Each of the piezoelectric elements 5 is an actuator extendable/contractable in the front-rear direction, and is formed in a generally rectangular plan view shape elongated in the front-rear direction. The piezoelectric element 5 is disposed so as to span the plate opening 12 in the front-rear direction.

Specifically, the both end portions of the piezoelectric elements 5 in the front-rear direction are adhesively bonded to the individual attachment regions 13 (broken lines of FIG. 1) in the front end portion of the rear plate portion 9 and in the rear end portion of the front plate portion 10 via adhesive layers 31, and fixed thereto.

As shown in FIG. 3, in the middle portion of the upper surface of each of the piezoelectric elements 5 in the front-rear direction, a piezoelectric terminal 34 is provided, and electrically connected to the piezoelectric-side terminal 40 (described later) of the suspension board with circuit 3.

Each of the piezoelectric elements 5 is supplied with electricity from the piezoelectric-side terminal 40, and the voltage thereof is controlled to extend/contract the piezoelectric element 5.

Next, a detailed description is given to the piezoelectric-side terminal 40 as an example of a terminal on one widthwise side in the suspension board with circuit 3. Note that the piezoelectric-side terminal 40 on the other widthwise side is formed to be symmetrical with the piezoelectric-side terminal 40 on one widthwise side with respect to the linear portion 20, and a description thereof is omitted.

In the suspension board with circuit 3, as shown in FIG. 6, a connecting arm 32 including the piezoelectric-side terminal 40 is provided.

The connecting arm 32 is provided so as to protrude widthwise outward in an arm-like shape from the middle portion of the linear portion 20 in the front-rear direction.

The connecting arm 32 includes a pad portion 33 disposed on one widthwise side of the linear portion 20 to be spaced apart therefrom, and a joint portion 41 coupling the pad portion 33 to the linear portion 20.

As shown in FIG. 4, the pad portion 33 includes the insulating base layer 28, the conductive layer 19 formed on the insulating base layer 28, and the insulating cover layer 29 formed on the insulating base layer 28 and around the conductive layer 19.

As shown in FIGS. 4 and 6, in the pad portion 33, the insulating base layer 28 includes an outer insulating portion 44 and an inner insulating portion 45.

The outer insulating portion 44 is formed in a generally annular (ring) plan view shape.

The inner insulating portion 45 is formed in a generally annular (ring) plan view shape having a vertical thickness thereof which is generally the same as that of the outer insulating portion 44. The inner insulating portion 45 is formed to be inwardly spaced apart from an outer opening 46. The inner insulating portion 45 is formed to be concentric with the outer insulating portion 44. The middle portion of the inner insulating portion 45 is formed with an inner opening 47 having a generally circular plan view shape and extending therethrough in the thickness direction.

The space defined by the inner peripheral surface of the outer insulating portion 44 and the outer peripheral surface of the inner insulating portion 45 is defined as the outer opening 46. The outer opening 46 is formed in a generally annular (ring) plan view shape. The outer opening 46 is formed to be concentric with the inner opening 47.

The inner opening 47 and the outer opening 46 form a base opening 48 as an example of a first opening.

In the pad portion 33, the conductive layer 19 is formed as the piezoelectric-side terminal 40, and the piezoelectric-side terminal 40 includes the outer conductive portion 50, an outer contact portion 51 as an example of a second contact portion, an inner conductive portion 52, and an inner contact portion 53 as an example of a first contact portion.

In planar view, the outer conductive portion 50 is formed in a generally annular (ring) plan view shape having the outer diameter thereof which is slightly smaller than the outer diameter of the outer insulating portion 44 and the inner diameter thereof which is generally the same as the inner diameter of the outer insulating portion 44 so as to overlap the outer insulating portion 44 when projected in the thickness direction. That is, the outer conductive portion 50 is laminated on the upper surface of the outer insulating portion 44.

In planar view, the outer contact portion 51 is formed in a generally annular (ring) plan view shape continued to the inner peripheral portion of the outer conductive portion 50 and having the outer diameter thereof which is generally the same as the inner diameter of the outer insulating portion 44 and the inner diameter thereof which is generally the same as the outer diameter of the inner insulating portion 45. The outer contact portion 51 is formed so as be recessed into the outer opening 46 such that the lower surface thereof protrudes below the insulating base layer 28 (outer insulating portion 44 and inner insulating portion 45).

In planar view, the inner conductive portion 52 is formed in a generally annular (ring) plan view shape continued to the inner peripheral portion of the outer contact portion 51 and having the outer diameter and inner diameter thereof which are generally the same as the outer diameter and inner diameter of the inner insulating portion 45 so as to overlap the inner insulating portion 45 when projected in the thickness direction. That is, the inner conductive portion 52 is laminated on the upper surface of the inner insulating portion 45.

In planar view, the inner contact portion 53 is formed in a generally circular plan view shape continued to the inner peripheral portion of the inner conductive portion 52 and having the outer diameter thereof which is generally the same as the inner diameter of the inner insulating portion 45. The inner contact portion 53 is formed to be recessed into the inner opening 47 such that the lower surface thereof is generally flush with the lower surface of the insulating base layer 28 (inner insulating portion 45).

That is, the inner contact portion 53 is formed to be inwardly spaced apart from the outer contact portion 51, and the lower surface of the outer contact portion 51 and the lower surface of the inner contact portion 53 are each exposed from the base opening 48 (outer opening 46 and inner opening 47). The inner contact portion 53 is formed to be concentric with the outer contact portion 51.

In the pad portion 33, the insulating cover layer 29 has a cover outer peripheral portion 57 and a cover inner peripheral portion 56.

In planar view, the cover outer peripheral portion 57 is formed in a generally annular (ring) plan view shape having the outer diameter thereof which is slightly smaller than the outer diameter of the outer insulating portion 44 and the inner diameter thereof which is generally the same as the outer diameter of the outer conductive portion 50 so as to overlap the outer insulating portion 44 when projected in the thickness direction. That is, the cover outer peripheral portion 57 is laminated on the upper surface of the outer insulating portion 44.

In planar view, the cover inner peripheral portion 56 is formed so as to inwardly protrude from the inner peripheral surface of the upper part of the cover outer peripheral portion 57 and cover the outer conductive portion 50. The cover inner peripheral portion 56 is formed in a generally annular (ring) plan view shape having the inner diameter thereof which is larger than the inner diameter of the outer conductive portion 50. The space defined by the inner peripheral surface of the cover inner peripheral portion 56 is defined as a cover opening 58 as an example of a second opening. The cover opening 58 is formed to be concentric with the base opening 48 (outer opening 46 and inner opening 47). From the cover opening 58, the upper surface of the conductive layer 19 (the upper surfaces of the inner part of the outer conductive portion 50, the outer contact portion 51, the inner conductive portion 52, and the inner contact portion 53) is exposed.

The dimensions of the pad portion 33 are appropriately selectively determined. As shown in FIG. 6, the outer diameter (maximum length) of the outer insulating portion 44 of the insulating base layer 28 is in a range of, e.g., 200 to 1000 μm, and the inner diameter (outer diameter (maximum length) of the outer opening 46) of the outer insulating portion 44 of the insulating base layer 28 and the outer diameter (maximum length) of the outer contact portion 51 of the conductive layer 19 are in a range of, e.g., 160 to 960 μm.

Also, the outer diameter (inner diameter (maximum length) of the outer opening 46) of the inner insulating portion 45 of the insulating base layer 28 and the inner diameter (maximum length) of the outer contact portion 51 of the conductive layer 19 are in a range of, e.g., 120 to 920 μm, and the inner diameter (outer diameter (maximum length) of the inner opening 47) of the inner insulating portion 45 of the insulating base layer 28 and the outer diameter (maximum length) of the inner contact portion 53 of the conductive layer 19 are in a range of, e.g., 80 to 880 μm.

A length L1 from the outer diameter of the outer contact portion 51 of the conductive layer 19 to the inner diameter thereof is in a range of, e.g., 20 to 200 μm, or preferably 30 to 100 μm.

If the length L1 is less than the ranges shown above, when a conductive adhesive 42 (described later) is injected into the outer contact portion 51, it may be impossible to sufficiently inhibit the conductive adhesive 42 (described later) from leaking out.

The outer diameter (maximum length) of the outer conductive portion 50 of the conductive layer 19 is in a range of, e.g., 180 to 980 μm.

Also, the outer diameter (maximum length) of the cover outer peripheral portion 57 of the insulating cover layer 29 is in a range of, e.g., 190 to 990 μm, and the inner diameter (inner diameter (maximum length) of the cover opening 58) of the insulating cover layer 29 is in a range of, e.g., 160 to 960 μm.

The dimensions of the piezoelectric-side terminal 40 are appropriately selectively determined. As shown in FIG. 4, when projected in the front-rear direction, a distance L2 between the lower surface of the outer contact portion 51 and the lower surface of the inner contact portion 53 in a vertical direction is in a range of, e.g., 1 to 50 μm, or preferably 2 to 20 μm.

If the distance L2, i.e., the depth (height) L2 of the irregularity of the piezoelectric-side terminal 40 is less than the ranges shown above, when the conductive adhesive 42 (described later) is injected into the outer contact portion 51, it may be impossible to sufficiently inhibit the conductive adhesive 42 (described later) from leaking out.

As shown in FIG. 6, the joint portion 41 connects one widthwise end portion of the middle portion of the linear portion 20 in the front-rear direction and the other widthwise end portion of the pad portion 33.

The joint portion 41 is formed in a generally rectangular plan view shape extending in the widthwise direction, and having a width (length in the front-rear direction shorter) smaller than the outer diameter of the pad portion 33. Note that the width of the joint portion 41 is not particularly limited, and may be the same as or larger than the outer diameter of the pad portion 33.

As shown in FIGS. 5 and 6, the joint portion 41 includes the insulating base layer 28, the power-source wire 25B formed on the insulating base layer 28, and the insulating cover layer 29 formed on the insulating base layer 28 so as to cover the power-source wire 25B.

In the joint portion 41, as shown in FIG. 6 the insulating base layer 28 is formed in a shape corresponding to the outer shape of the joint portion 41. The insulating base layer 28 in the joint portion 41 is formed continuously to the insulating base layer 28 in the linear portion 20 and to the insulating base layer 28 in the pad portion 33.

The power-source wire 25B in the joint portion 41 is formed so as to extend along the widthwise direction, and formed continuously to the power-source wire 25B of the linear portion 20 and to the other widthwise end portion of the outer conductive portion 50 of the pad portion 33.

In the joint portion 41, the insulating cover layer 29 is formed to cover the upper surface and side surfaces of the power-source wire 25B in continuous relation to the other widthwise end portion of the cover outer peripheral portion 47 of the pad portion 33.

Note that, in the suspension board with circuit 3, as shown in FIGS. 3 and 5, protective thin films 60 are formed on the respective surfaces of the individual terminals, which are specifically the front-side terminals 26 (see FIG. 1), the rear-side terminals 27 (see FIG. 1), and the pad portions 33.

In each of the pad portions 33, the protective thin film 60 is formed on each of the upper surfaces of the piezoelectric-side terminal 40 (the upper surface of the inner part of the outer conductive portion 50, the upper surface of the outer contact portion 51, the upper surface of the inner conductive portion 52, and the upper surface of the inner contact portion 53) and the lower surface of the piezoelectric-side terminal 40 exposed from the base opening 48 (the lower surface of the outer contact portion 51 and the lower surface of the inner contact portion 53).

The protective thin films 60 are formed of a metal material such as, e.g., nickel or gold. Each of the protective thin films 60 may be formed of a single layer of gold or the like or a multiple layer of nickel, gold, and the like. In such a case, the thickness of the protective thin film 60 is such that nickel has a thickness in a range of, e.g., 0.01 to 3 μm and gold has a thickness in a range of, e.g., 0.3 to 3.2 μm.

Next, a producing method of the assembly 1 is described.

To produce the assembly 1, each of the suspension board with circuit 3, the support plate 2, and the piezoelectric elements 5 is prepared.

First, a method of preparing (producing) the suspension board with circuit 3 is described with reference to FIGS. 7 and 8.

In the method, as shown in FIG. 7(a), the metal supporting board 18 is prepared first.

Next, as shown in FIG. 7(b), the insulating base layer 28 is formed on the metal supporting board 18 (on one side in the thickness direction in the production process views of FIGS. 7 and 8, which holds true hereinafter).

Specifically, the insulating base layer 28 is formed on the metal supporting board 18 into a pattern formed with piezoelectric-side-terminal formation regions 64 corresponding to the piezoelectric-side terminals 40 to be subsequently formed.

Each of the piezoelectric-side-terminal formation regions 64 includes an outer-conductive-portion formation region 65, an outer-contact-portion formation region 66, an inner-conductive-portion formation region 67, and an inner-contact-portion formation region 68.

The thickness of the insulating base layer 28 of each of the outer-conductive-portion formation region 65 and the inner-conductive-portion formation region 67 is generally the same as the thickness of the insulating base layer 28 of the joint portion 41. On the other hand, the insulating base layer 28 of the inner-contact-portion formation region 68 is formed to have a thickness smaller than the thickness of the insulating base layer 28 of each of the outer-conductive-portion formation region 65 and the inner-conductive-portion formation region 67.

The thickness of the insulating base layer 28 of the inner-contact-portion formation region 68 is in a range of, e.g., 15 to 50% of the thickness of the insulating base layer 28 of, e.g., each of the outer-conductive-portion formation region 65 and the inner-conductive-portion formation region 67, and is specifically in a range of 1 to 50 μm.

Specifically, to form the insulating base layer 28, for example, a varnish of a photosensitive insulating material is coated first on the upper surface of the metal supporting board 18 and dried to form a photosensitive base coating.

Next, the photosensitive base coating is subjected to light exposure (gradation exposure) via a gradation exposure photomask not shown. The gradation exposure photomask includes a light shielding portion, a light semi-transmitting portion, and a light full transmitting portion in a pattern. The light full transmitting portion is disposed to face the portions of the base coating where the insulating base layer 28 in the outer-conductive-portion formation region 65 and the inner-conductive-portion formation regions 67 are to be formed. The light semi-transmitting portion is disposed to face the portions of the base coating where the insulating base layer 28 in the inner-contact-portion formation regions 68 is to be formed. The light shielding portion is disposed to face the portions of the base coating where the outer-contact-portion formation regions 66 are to be formed (i.e., the portions thereof where the insulating base layer 28 is not formed).

Then, the base coating subjected to the gradation exposure is developed, and cured by heating as necessary to form the insulating base layer 28 into a pattern formed with the outer-conductive-portion formation regions 65, the outer-contact-portion formation regions 66, the inner-conductive-portion formation regions 67, and the inner-contact-portion formation regions 68.

Next, as shown in FIG. 7(c), the conductive layer 19 is formed on the insulating base layer 28 and the upper surface of the metal supporting board 18 exposed from the outer-contact-portion formation regions 66 by an additive method, a subtractive method, or the like.

That is, as shown in FIG. 1, the conductive layer 19 is formed to include the wires 25 formed on the insulating base layer 28, and the front-side terminals 26, the rear-side terminals 27, and the piezoelectric-side terminals 40 each continued thereto.

Specifically, as shown in FIG. 7(e), each of the piezoelectric-side terminals 40 is formed in the piezoelectric-side-terminal formation region 64 of the insulating base layer 28. More specifically, the piezoelectric-side terminal 40 is formed to follow the upper surface of the insulating base layer 28 in the inner-contact-portion formation region 68, the upper surface of the insulating base layer 28 in the inner-conductive-portion formation region 67, the upper surface of the insulating base layer 28 in the outer-contact-portion formation region 66, and the upper surface of the insulating base layer 28 in the outer-conductive-portion formation region 65 and have a generally equal thickness throughout planar directions (front-rear direction and widthwise direction).

In this manner, the conductive layer 19 having the shape described above is formed.

Next, as shown in FIGS. 5 and 6, the insulating cover layer 29 is formed in the pattern described above.

Specifically, a varnish of a photosensitive insulating material is coated on the entire upper surface of the metal supporting board 18 including the conductive layer 19 and the insulating base layer 28 and the upper surfaces and outer peripheral surfaces of the outer parts of the outer conductive portions 50, dried, exposed to light, developed, and then cured by heating.

Next, as shown in FIG. 8(d), the metal supporting board 18 is removed from the piezoelectric-terminal formation regions 64.

To remove the metal supporting board 18 from the piezoelectric-terminal formation regions 64, the removal is performed by, e.g., an etching method such as dry etching (e.g., plasma etching) or wet etching (e.g., chemical etching), drilling perforation, laser processing, or the like. Preferably, the removal is performed by wet etching.

In this manner, the lower portion of the outer contact portion 51 in each of the outer-contact-portion formation regions 66 is removed to thereby form the outer opening 46 so that the lower surface of the outer contact portion 51 is exposed from the outer opening 46.

Note that, simultaneously with the removal of the metal supporting board 18 from the piezoelectric-terminal formation regions 64, the metal supporting board 18 is trimmed to form the front portion 15, the wiring portion 16, and the rear portion 17.

Next, as shown in FIG. 8(e), the insulating base layer 28 in the outer-conductive-portion formation regions 65 and the inner-conductive-portion formation regions 67 is partially removed, and the insulating base layer 28 in the inner-contact-portion formation regions 68 is entirely removed.

The insulating base layer 28 is removed by, e.g., etching, or preferably wet etching or the like.

As a result, the lower portion of the insulating base layer 28 in each of the inner-conductive-portion formation regions 67 and the inner-contact-portion formation regions 68 is removed to thereby form the inner openings 47 and expose the lower surfaces of the inner contact portions 53 from the inner openings 47.

Thus, in each of the pad portions 33, the outer contact portion 51 is formed around the inner contact portion 53 to be spaced apart therefrom and protrude below the inner contact portion 53.

Thereafter, as shown in FIG. 8(f), the protective thin film 60 is formed over each of the upper surfaces of the front-side terminals 26 (see FIG. 1), the rear-side terminals 27 (see FIG. 1), and the outer conductive portions 50, the upper and lower surfaces of the outer contact portions 51, the upper surfaces of the inner conductive portions 52, and the upper and lower surfaces of the inner contact portions 53.

In this manner, the suspension board with circuit 3 is prepared (produced).

Next, as shown in FIGS. 1 and 2, the suspension board with circuit 3, the support plate 2, and the piezoelectric elements 5 are assembled.

Specifically, the suspension board with circuit 3 is disposed on the upper surface of the support plate 2. That is, as shown in FIG. 1, the suspension board with circuit 3 is fixed to the support plate 2 by means of, e.g., welding, an adhesive, or the like such that the linear portion 20 of the wiring portion 16 traverses the widthwise middle portion between the plate openings 12, the bent portion 21 thereof is disposed on the one widthwise end portion and front end portion of the rear plate portion 9, and the front portion 15 is disposed on the widthwise middle portion of the load beam portion 8 throughout the front-rear direction of the load beam portion 8.

Thereafter, as shown in FIG. 3, each of the piezoelectric elements 5 is fixed to the support plate 2, while the lower surfaces (surfaces on one side in the thickness direction) of the outer contact portion 51 and the inner contact portion 53 of the piezoelectric-side terminal 40 are electrically connected to the piezoelectric terminal 34 of the piezoelectric element 5.

To fix the piezoelectric elements 5 to the support plate 2, as shown in FIG. 3(a), the adhesive layers 31 are disposed on the attachment regions 13 of the actuator plate portion 6 and, via the adhesive layers 31, the both end portions of the piezoelectric elements 5 in the front-rear direction are attached to the attachment regions 13. As shown in FIG. 1, the piezoelectric elements 5 are disposed in the plate openings 12 and on the both widthwise outsides of the linear portion 20 of the suspension board with circuit 3 to be spaced apart therefrom.

Then, as shown in FIGS. 3(a) and 5, via the conductive adhesive 42, each of the piezoelectric-side terminals 40 of the suspension board with circuit 3 and the piezoelectric terminal 34 of the corresponding piezoelectric element 5 are electrically connected. Specifically, between the piezoelectric-side terminal 40 and the piezoelectric terminal 34, the conductive adhesive 42 is interposed and, by, e.g., heating the piezoelectric-side terminal 40, the piezoelectric terminal 34, and the conductive adhesive 42 to a relatively low temperature (specifically in a range of 100 to 200 C.°), the piezoelectric-side terminal 40 and the piezoelectric terminal 34 are adhesively bonded together, while being electrically connected via the conductive adhesive 42.

The conductive adhesive 42 is a connecting medium (e.g., a conductive paste such as a silver paste) which exhibits an adhesive action by being heated at a relatively low temperature (in a range of, e.g., 100 to 200° C.). The piezoelectric-side terminal 40 is electrically connected to the piezoelectric terminal 34 of the piezoelectric element 5 via the conductive adhesive 42 and also adhesively bonded to the piezoelectric terminal 34.

At this time, as shown in FIG. 3(b), when the amount of the conductive adhesive 42 is large, the conductive adhesive 42 is interposed between the outer contact portion 51 and the piezoelectric terminal 34. As a result, the outer contact portion 51 and the piezoelectric terminal 34 are electrically connected via the conductive adhesive 42.

As shown in FIG. 3(c), when the amount of the conductive adhesive 42 is small, the conductive adhesive 42 is interposed only between the inner contact portion 53 and the piezoelectric terminal 34. As a result, the outer contact portion 51 comes in direct contact with the piezoelectric terminal 34 and is electrically connected thereto.

In addition, as shown in FIGS. 1 and 2, the slider 22 mounting thereon the magnetic head (not shown) is mounted on the gimbal 23 to electrically connect the magnetic head (not shown) and the front-side terminals 26.

Moreover, the read/write board (not shown) is electrically connected to the external terminals 27A, and the power source (not shown) is electrically connected to the power-source-side terminals 27B.

Furthermore, the drive coil (not shown) is attached to the base plate portion 7.

In this manner, the assembly 1 is obtained. The obtained assembly 1 is mounted in the hard disk drive (not shown).

In the hard disk drive, the slider 22 of the assembly 1 circumferentially travels relative to a rotating hard disk in the form of a circular plate, while being floated over the surface of the hard disk with a minute gap being held therebetween. Meanwhile, the magnetic head (not shown) of the assembly 1 reads/writes information, while moving in the radial direction of the hard disk based on driving by the drive coil.

In addition, by the extension/contraction of the piezoelectric elements 5, the position of the magnetic head relative to the hard disk drive is accurately and finely adjusted.

That is, electricity is supplied from the power source (not shown) to one of the piezoelectric elements 5 via the power-source-side terminal 27B, the power-source wire 25B, and the piezoelectric-side terminal 40, and the voltage thereof is controlled to contract the piezoelectric element 5. As a result, the front end portion of the rear plate portion 9 and the rear end portion of the front plate portion 10 in one widthwise end portion come closer to each other, while being flexibly supported on the flexible portion 11.

At the same time, electricity is supplied from the power source (not shown) to the other piezoelectric element 5 via the power-source-side terminal 27B, the power-source wire 25B, and the piezoelectric-side terminal 40, and the voltage thereof is controlled to extend the piezoelectric element 5. As a result, the front end portion of the rear plate portion 9 and the rear end portion of the front plate portion 10 in the other widthwise end portion go farther away from each other, while being flexibly supported on the flexible portion 11.

Consequently, the front plate portion 10 and the load beam portion 8 swing around the widthwise middle point of the front end portion of the rear plate portion 9 toward one widthwise side. At the same time, the suspension board with circuit 3 and the slider 22 which are fixed to the load beam portion 8 swing toward one widthwise side.

On the other hand, when one of the piezoelectric elements 5 is extended and the other piezoelectric element 5 is contracted, the front plate portion 10 and the load beam portion 8 swing in a direction opposite to the direction described above.

In this manner, it is possible to accurately and finely adjust the position of the magnetic head with respect to the hard disk drive.

In the suspension board 3 with circuit, each of the inner contact portions 53 can be connected to the piezoelectric terminal 34 of the piezoelectric element 5 via the conductive adhesive 42.

In addition, since the outer contact portion 51 is provided around the inner contact portion 53 to protrude below (on one side in the thickness direction of) the inner contact portion 53, it is possible to inhibit the conductive adhesive 42 from leaking to the outside of the outer contact portion 51 using the outer contact portion 51.

Moreover, since the outer contact portion 51 protrudes below (on one side in the thickness direction of) the inner contact portion 53, it is possible to connect the outer contact portion 51 to the piezoelectric terminal 34 of the piezoelectric element 5 either directly or via the conductive adhesive 42.

This can increase the contact area of the piezoelectric-side terminal 40 electrically connected to the piezoelectric element 5 without increasing the size of the piezoelectric-side terminal 40.

As a result, it is possible to inhibit the conductive adhesive 42 from leaking to the outside of the outer contact portion 51, while inhibiting the piezoelectric-side terminal 40 from being increased in size, and also sufficiently improve the reliability of the electrical connection between the piezoelectric-side terminal 40 and the piezoelectric element 5.

Additionally, since the piezoelectric terminal 34 of the piezoelectric element 5 is electrically connected to the wire 25, the given voltage can be converted to a driving force for extending/contracting the piezoelectric element 5.

Consequently, it is possible to finely adjust the position of the suspension board with circuit 3.

Moreover, since the insulating base layer 28 is provided under (on one side in the thickness direction of) the piezoelectric-side terminal 40 and the base opening 48 is formed in the insulating base layer 28, the lower surfaces of the outer contact portion 51 and the inner contact portion 53 of the piezoelectric-side terminal 40 can be exposed from the base opening 48.

Accordingly, it is possible to support (reinforce) each of the pad portions 33 from thereunder using the insulating base layer 28 and also electrically connect the lower surface of the piezoelectric-side terminal 40 and the piezoelectric terminal 34 of the piezoelectric element 5.

As a result, it is possible to improve the mechanical strength of the piezoelectric-side terminal 40 and thereby improve the reliability of the connection between the piezoelectric-side terminal 40 and the piezoelectric terminal 34.

In addition, since the outer contact portion 51 of the piezoelectric-side terminal 40 protrudes below (on one side in the thickness direction of) the insulating base layer 28 (outer insulating portion 44 and inner insulating portion 45), the outer contact portion 51 can be reliably connected to the piezoelectric terminal 34 of the piezoelectric element 5.

This can inhibit the conductive adhesive 42 from leaking out using the outer contact portion 51 and also ensure the contact area of the piezoelectric-side terminal 40 electrically connected to the piezoelectric terminal 34 of the piezoelectric element 5.

Moreover, since the insulating cover layer 29 is provided over (on the other side in the thickness direction of) the piezoelectric-side terminal 40 and the cover opening 58 is formed in the insulating cover layer 29, the upper surface of the piezoelectric-side terminal 40 can be exposed from the cover opening 58.

Therefore, it is also possible to electrically connect the upper surface of the piezoelectric-side terminal 40 and the piezoelectric terminal 34 of the piezoelectric element 5, while improving the mechanical strength of the piezoelectric-side terminal 40.

Figure 9:
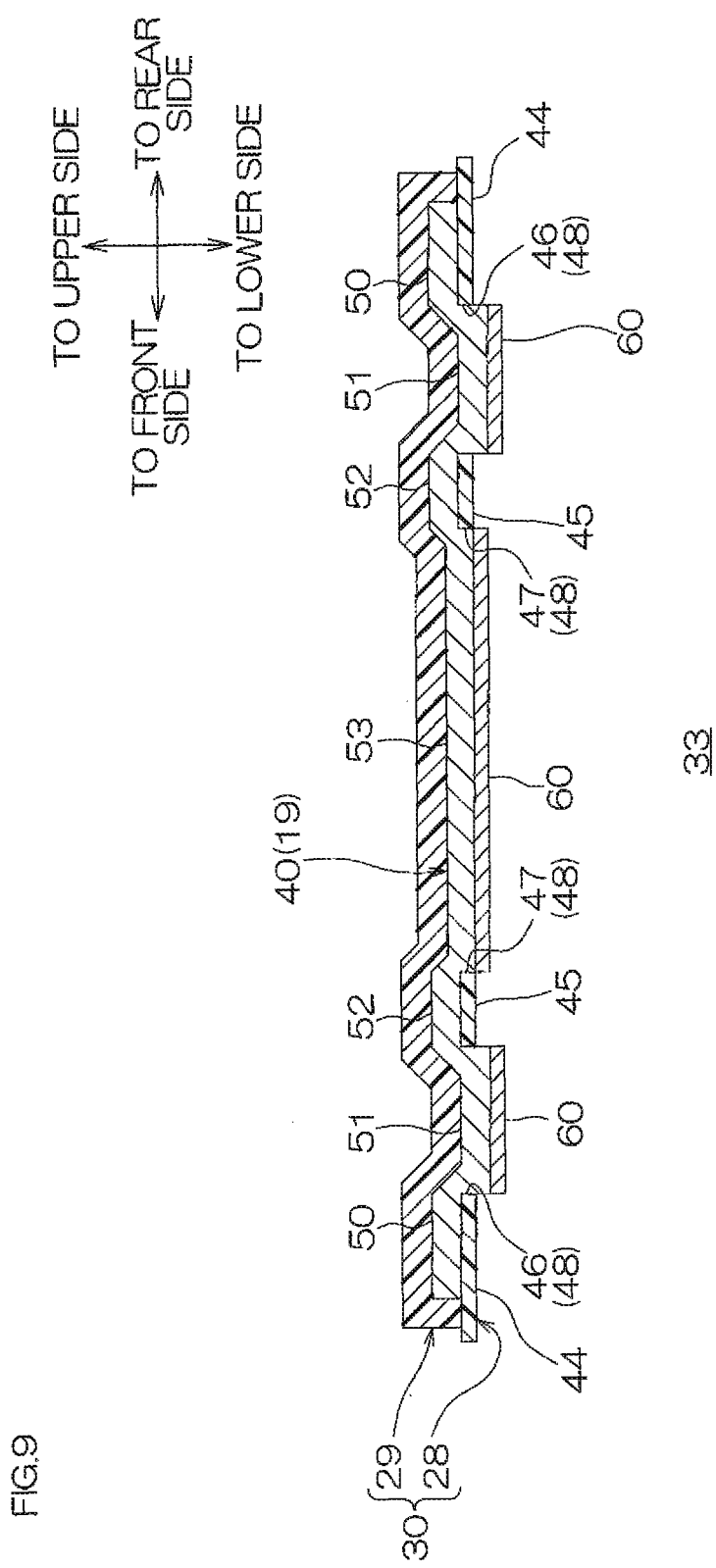
FIG. 9 shows a cross-sectional view of a pad portion (form which includes an insulating cover layer laminated on the entire upper surface of the pad portion) of a suspension board with circuit as another embodiment of the wired circuit board of the present invention.
Figure 10:
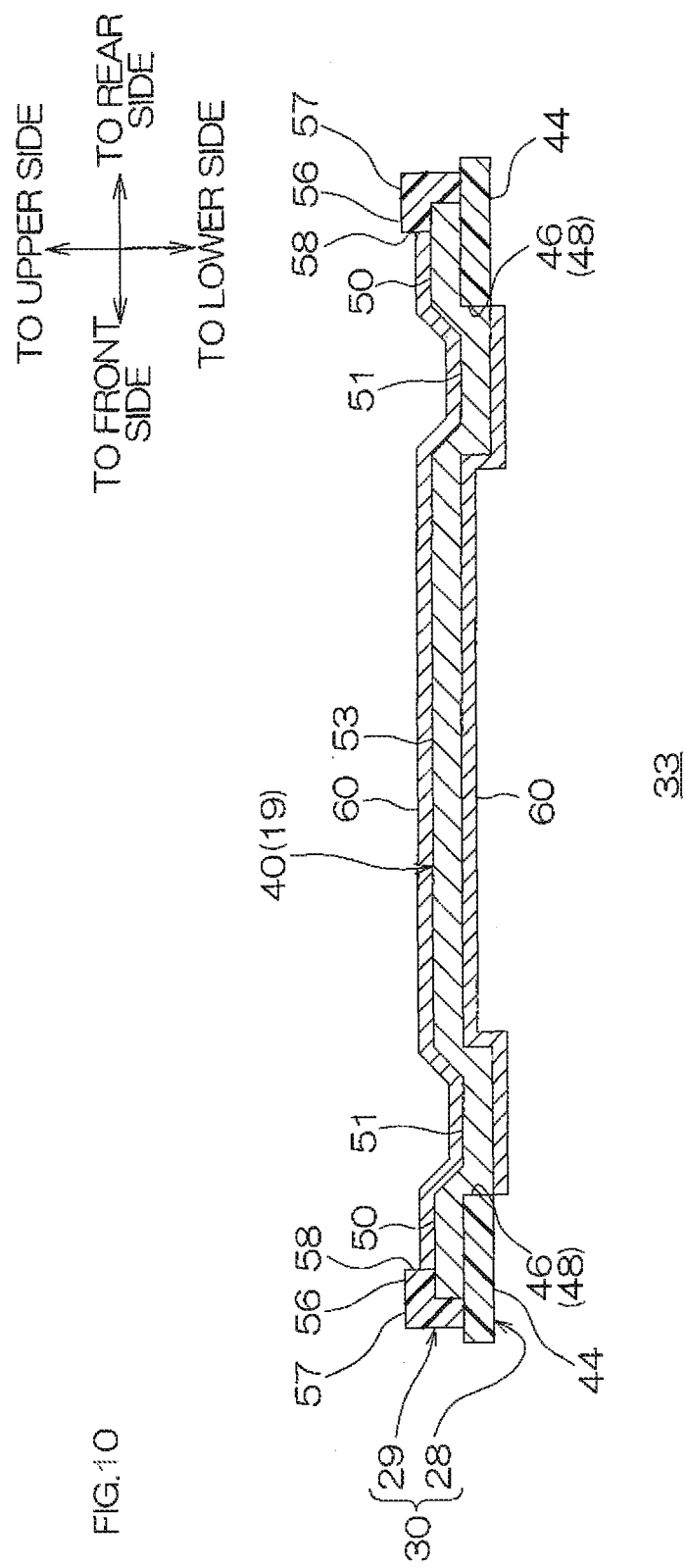
FIG. 10 shows a cross-sectional view of a pad portion (form in which an inner contact portion is formed to be continued to the inner peripheral portion of an outer contact portion and which includes an insulating cover layer formed with a cover opening) of a suspension board with circuit as still another embodiment of the wired circuit board of the present invention.
Figure 11:
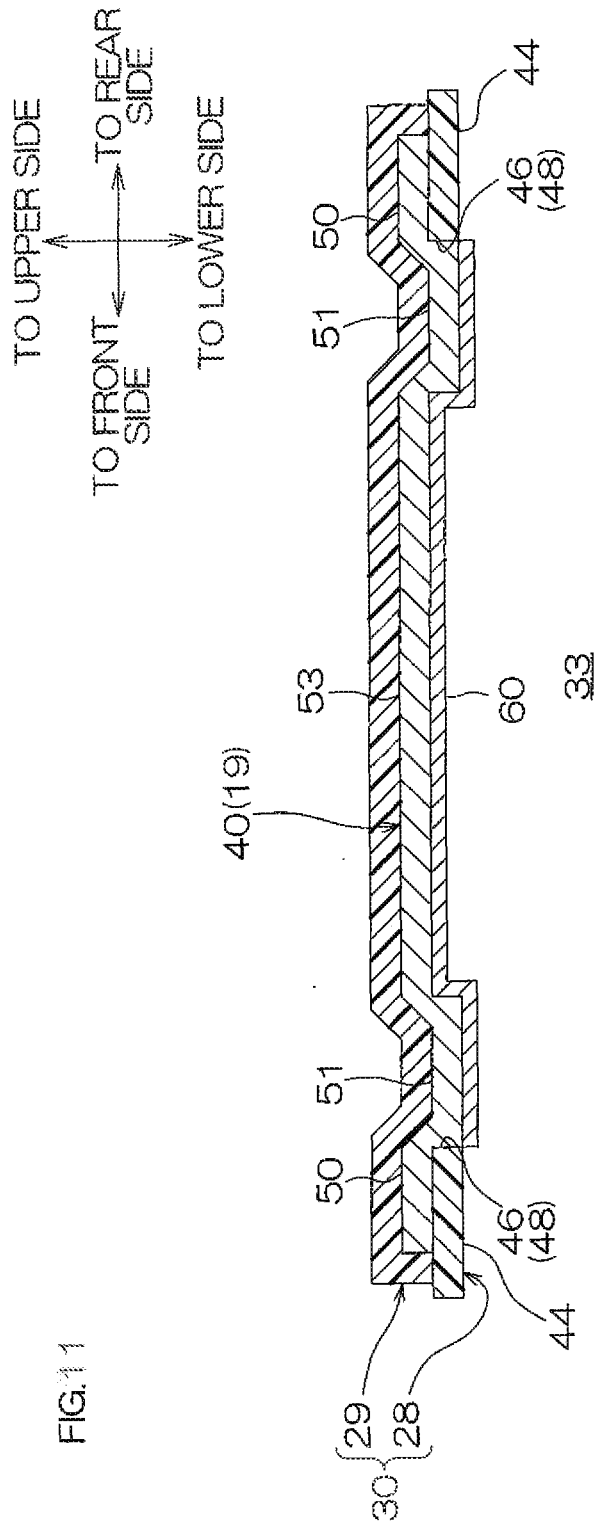
FIG. 11 shows a cross-sectional view of a pad portion (form in which an inner contact portion is formed to be continuous to the inner peripheral portion of an outer contact portion and which includes an insulating cover layer laminated on the entire upper surface of the pad portion) of a suspension board with circuit as yet another embodiment of the wired circuit board of the present invention.
Figure 12:
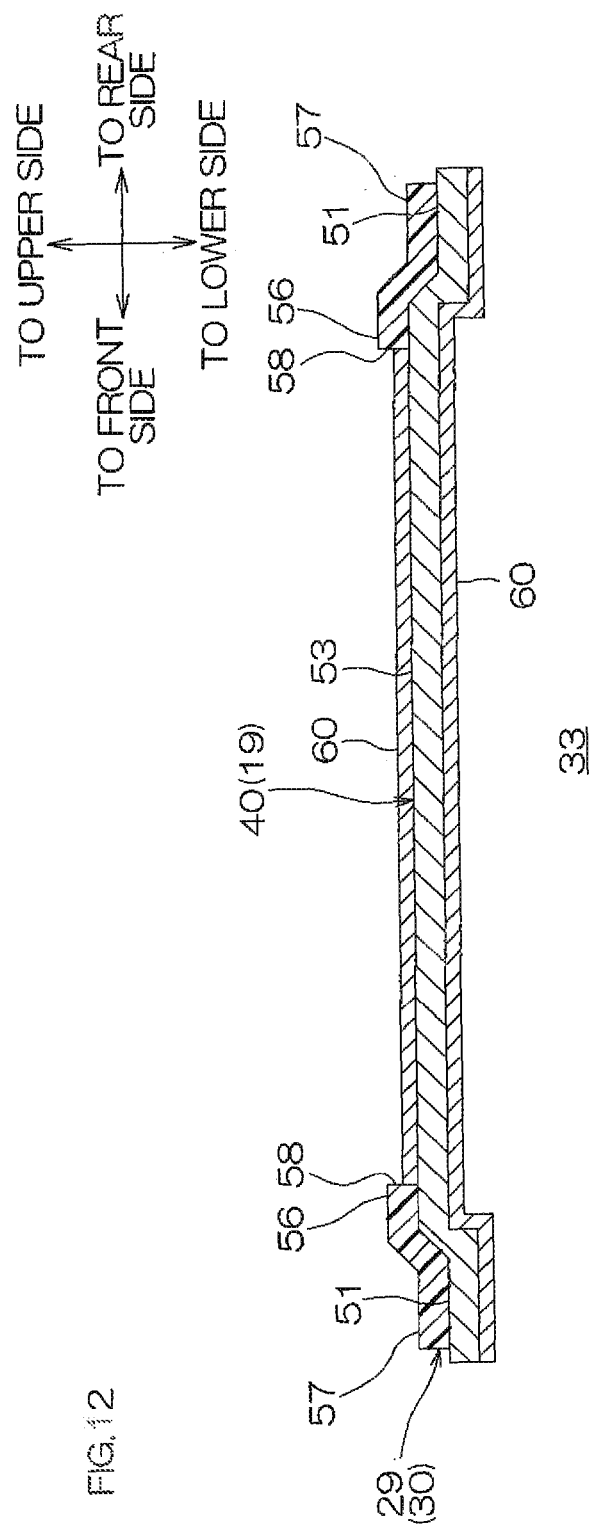
FIG. 12 shows a cross-sectional view of a pad portion (form which does not include an insulating base layer, but includes an insulating cover layer formed with a cover opening) of a suspension board with circuit as still another embodiment of the wired circuit board of the present invention.
Figure 13:
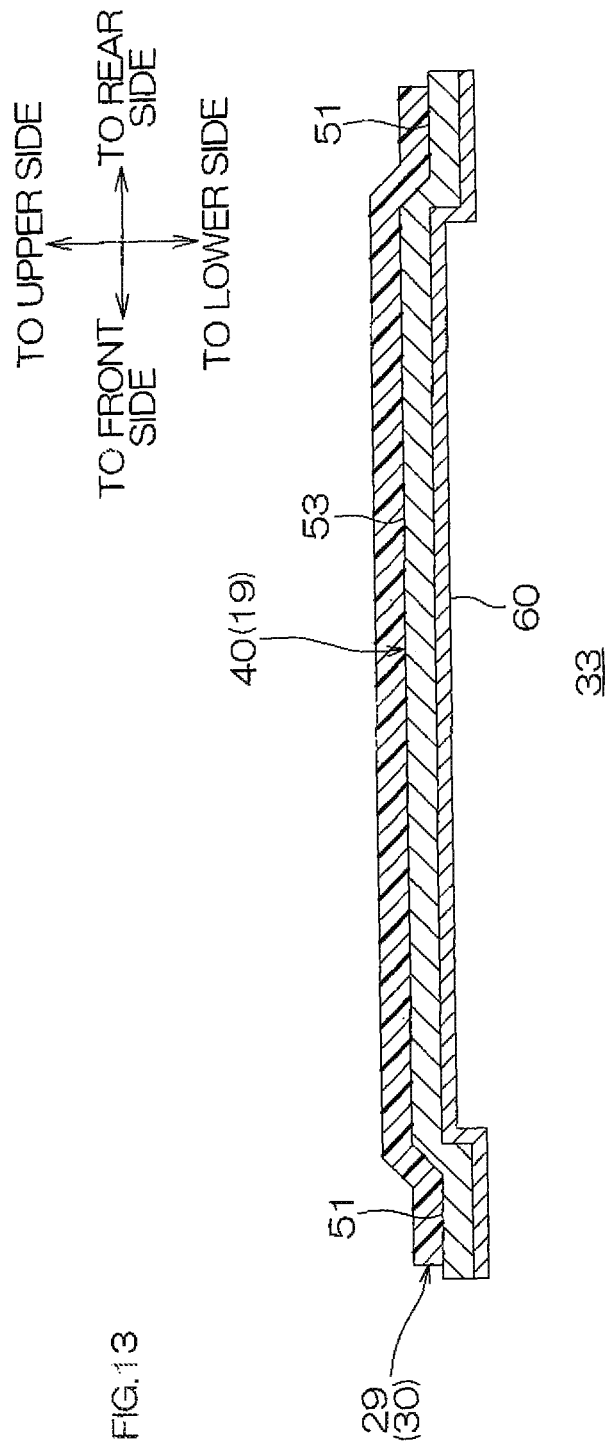
FIG. 13 shows a cross-sectional view of a pad portion (form which does not include an insulating base layer, but includes an insulating cover layer laminated on the entire upper surface of the pad portion) of a suspension board with circuit as yet another embodiment of the wired circuit board of the present invention.
Figure 14:
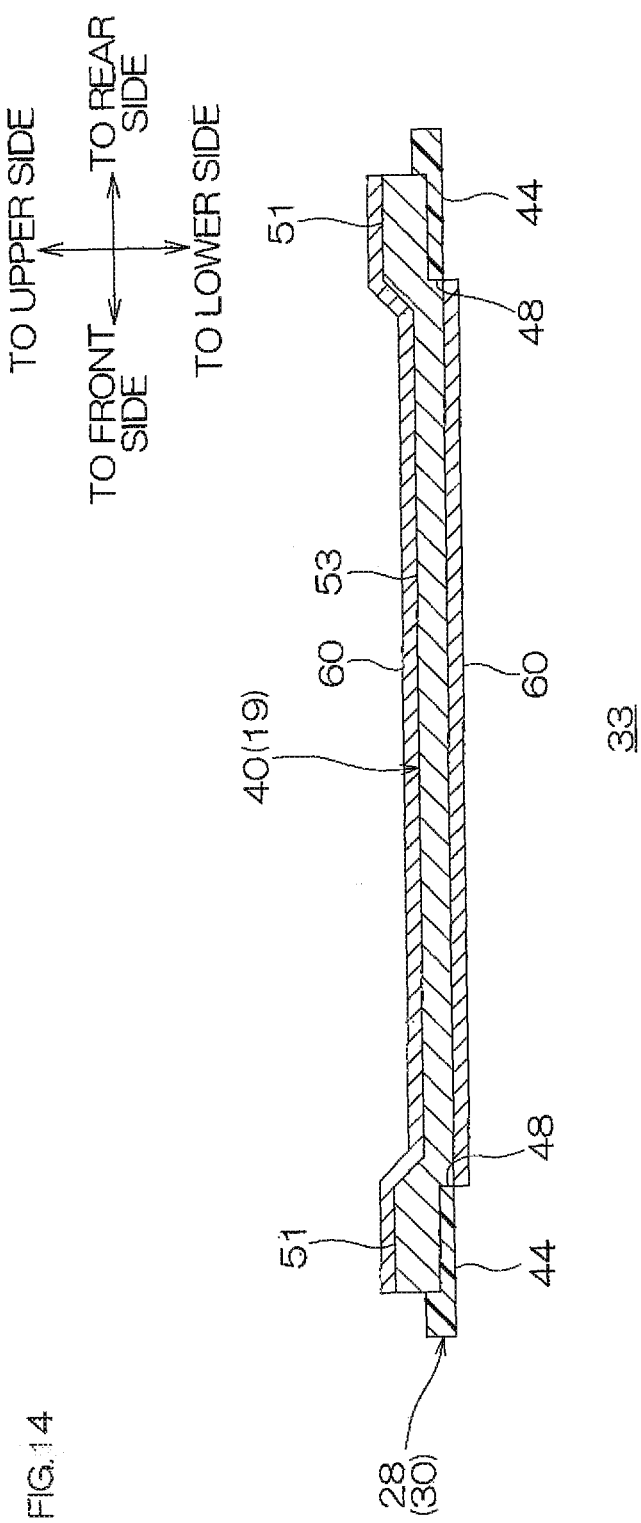
FIG. 14 shows a cross-sectional view of a pad portion (form which includes an insulating base layer and is connected to a piezoelectric terminal 34 on the upper side thereof) of a suspension board with circuit as still another embodiment of the wired circuit board of the present invention.
Figure 15:
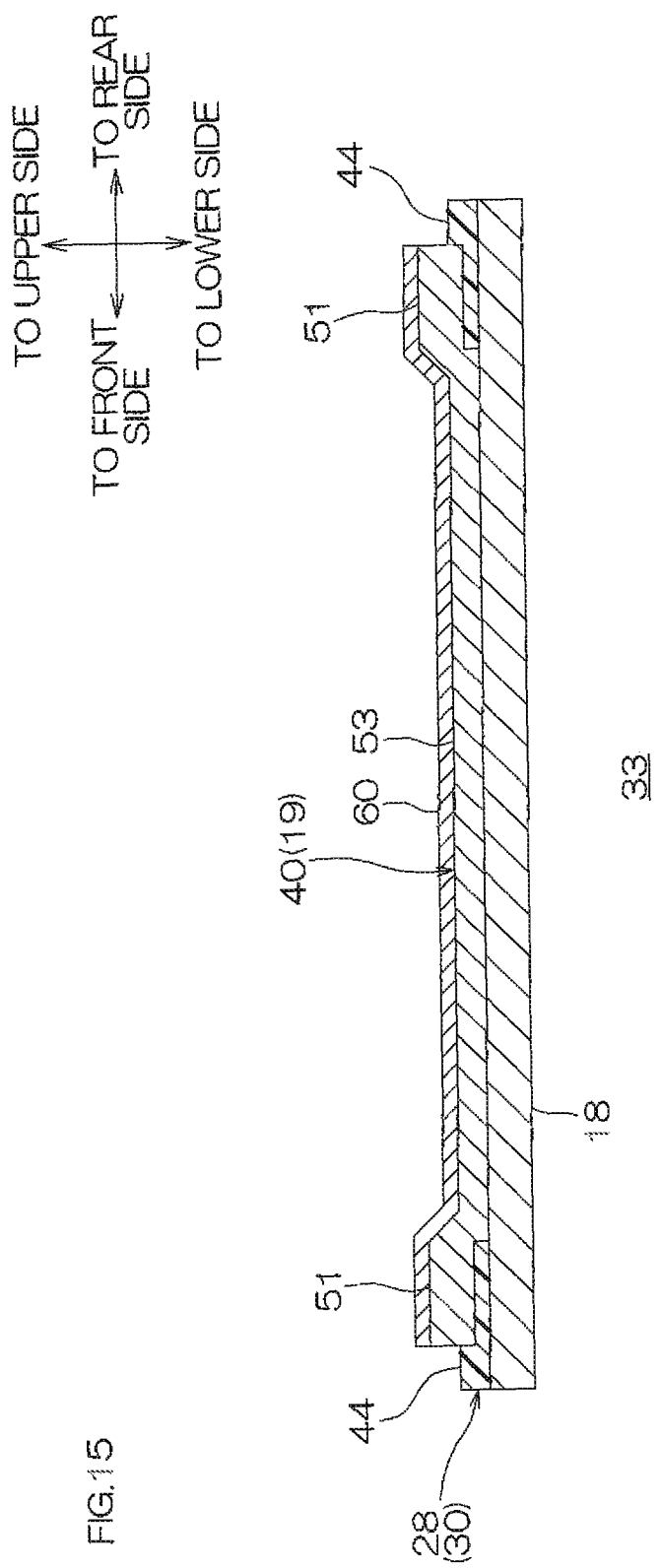
FIG. 15 shows a cross-sectional view of a pad portion (form in which a metal supporting board is formed in a generally circular plan view shape) of a suspension board with circuit as yet another embodiment of the wired circuit board of the present invention.

FIG. 9 shows a cross-sectional view of a pad portion (form which includes an insulating cover layer laminated on the entire upper surface of the pad portion) of a suspension board with circuit as another embodiment of the wired circuit board of the present invention. FIG. 10 shows a cross-sectional view of a pad portion (form in which an inner contact portion is formed to be continued to the inner peripheral portion of an outer contact portion and which includes an insulating cover layer formed with a cover opening) of a suspension board with circuit as still another embodiment of the wired circuit board of the present invention. FIG. 11 shows a cross-sectional view of a pad portion (form in which an inner contact portion is formed to be continuous to the inner peripheral portion of an outer contact portion and which includes an insulating cover layer laminated on the entire upper surface of the pad portion) of a suspension board with circuit as yet another embodiment of the wired circuit board of the present invention. FIG. 12 shows a cross-sectional view of a pad portion (form which does not include an insulating base layer, but includes an insulating cover layer formed with a cover opening) of a suspension board with circuit as still another embodiment of the wired circuit board of the present invention. FIG. 13 shows a cross-sectional view of a pad portion (form which does not include an insulating base layer, but includes an insulating cover layer laminated on the entire upper surface of the pad portion) of a suspension board with circuit as yet another embodiment of the wired circuit board of the present invention. FIG. 14 shows a cross-sectional view of a pad portion (form which includes an insulating base layer and is connected to the piezoelectric terminal 34 on the upper side thereof) of a suspension board with circuit as still another embodiment of the wired circuit board of the present invention. FIG. 15 shows a cross-sectional view of a pad portion (form in which a metal supporting board is formed in a generally circular plan view shape) of a suspension board with circuit as yet another embodiment of the wired circuit board of the present invention. FIG. 16 shows a cross-sectional view of a pad portion (form which does not include either an insulating base layer or an insulating cover layer and is connected to the piezoelectric terminal 34 on the upper side thereof) of a suspension board with circuit as still another embodiment of the wired circuit board of the present invention.

Note that, in each of the drawings mentioned hereinafter, members corresponding to the individual components described above are provided with the same reference numerals, and a detailed description thereof is omitted.

In the embodiment of FIG. 4, in each of the pad portions 33, the insulating cover layer 29 is formed with the cover opening 58. However, as shown in, e.g., FIG. 9, the insulating cover layer 29 can also be formed to be laminated on the entire upper surface of the pad portion 33.

In the embodiment of FIG. 9, not only the same function and effect as achieved in the embodiment of FIG. 4 are achieved, but also the pad portion 33 can be supported (reinforced) by the insulating cover layer 29. Therefore, it is possible to improve the mechanical strength of the piezoelectric-side terminal 40 and thereby improve the reliability of the connection between the piezoelectric-side terminal 40 and the piezoelectric terminal 34.

In the embodiment of FIG. 4, in each of the pad portions 33, the inner insulating portion 45 is formed. However, as shown in, e.g., FIG. 10, it is possible to increase the area of the inner contact portion 53 without forming the inner insulating portion 45. That is, in the piezoelectric-side terminal 40, the inner conductive portion 52 is not formed, and the inner contact portion 53 is formed to be continued to the inner peripheral portion of the outer contact portion 51.

In the embodiment of FIG. 10, not only the same function and effect as achieved in the embodiment of FIG. 4 are achieved, but also the area of the inner contact portion 53 can be increased accordingly because of the absence of the inner insulating portion 45. This allows an improvement in the reliability of the connection between the piezoelectric-side terminal 40 and the piezoelectric terminal 34.

Also, in the embodiment of FIG. 10, in the pad portion 33, the insulating cover layer 29 is formed with the cover opening 58. However, as shown in, e.g., FIG. 11, the insulating cover layer 29 can also be formed to be laminated on the entire upper surface of the pad portion 33.

In the embodiment of FIG. 11, not only the same function and effect as achieved in the embodiment of FIG. 10 are achieved, but also the pad portion 33 can be supported (reinforced) by the insulating cover layer 29. Therefore, it is possible to improve the mechanical strength of the piezoelectric-side terminal 40 and thereby improve the reliability of the connection between the piezoelectric-side terminal 40 and the piezoelectric terminal 34.

In the embodiment of FIG. 4, in each of the pad portions 33, the outer insulating portion 44 and the inner insulating portion 45 are formed. However, as shown in, e.g., FIG. 12, it is possible to increase the area of each of the outer contact portion 51 and the inner contact portion 53 without forming either the outer insulating portion 44 or the inner insulating portion 45. That is, in the piezoelectric-side terminal 40, the outer conductive portion 50 and the inner conductive portions 52 are not formed, and the inner contact portion 53 is formed to be continued to the inner peripheral portion of the outer contact portion 51.

In the embodiment of FIG. 12, not only the same function and effect as achieved in the embodiment of FIG. 4 are achieved, but also the area of each of the outer insulating portion 44 and the inner insulating portion 45 can be increased accordingly because of the absence of the outer insulating portion 44 and the inner insulating portion 45. This allows an improvement in the reliability of the connection between the piezoelectric-side terminal 40 and the piezoelectric terminal 34.

Also, in the embodiment of FIG. 12, in the pad portion 33, the insulating cover layer 29 is formed with the cover opening 58. However, as shown in, e.g., FIG. 13, the insulating cover layer 29 can also be formed to be laminated on the entire upper surface of the pad portion 33.

In the embodiment of FIG. 13, not only the same function and effect as achieved in the embodiment of FIG. 12 are achieved, but also the pad portion 33 can be supported (reinforced) by the insulating cover layer 29. Therefore, it is possible to improve the mechanical strength of the piezoelectric-side terminal 40 and thereby improve the reliability of the connection between the piezoelectric-side terminal 40 and the piezoelectric terminal 34.

Also, in the embodiment of FIG. 4, on the upper surface of each of the pad portions 33, the insulating cover layer 29 is formed. However, as shown in, e.g., FIG. 14, the outer contact portion 51 can also be formed to protrude above the inner contact portion 53 without forming the insulating cover layer 29.

In the embodiment of FIG. 14, the insulating base layer 28 corresponds to an example of the second insulating layer, the base opening 48 corresponds to an example of the second opening, and the conductive adhesive 42 is injected from above (from one side in the thickness direction of) the piezoelectric-side terminal 40.

Additionally, when the conductive adhesive 42 is injected over the upper surface of the piezoelectric-side terminal 40, it is possible to inhibit the conductive adhesive 42 from leaking out using the outer contact portion 51, and electrically connect the upper surface of the piezoelectric-side terminal 40 to the piezoelectric terminal 34.

In the embodiment of FIG. 14, not only the same function and effect as achieved in the embodiment of FIG. 4 are achieved, but also the insulating cover layer 29 need not be additionally provided and the upper surface of the piezoelectric-side terminal 40 can be electrically connected to the piezoelectric terminal 34. This allows a reduction in the number of the components.

In the embodiment of FIG. 14, the piezoelectric-side terminal 40 is exposed from the base opening 48. However, as shown in, e.g., FIG. 15, under the pad portion 33, the metal supporting board 18 can be formed in a generally circular plan view shape.

In FIG. 15, with the upper surface of the metal supporting board 18, the lower surface of the piezoelectric-side terminal 40 and the lower surface of the insulating base layer 28 are in contact.

Also, the conductive adhesive 42 is injected over the upper surface of the piezoelectric-side terminal 40 to electrically connect the upper surface of the piezoelectric-side terminal 40 to the piezoelectric terminal 34 disposed thereover.

In the embodiment of FIG. 15, not only the same function and effect as achieved in the embodiment of FIG. 14 are achieved, but also the piezoelectric-side terminal 40 is supported by the insulating base layer 28 and the metal supporting board 18. Therefore, it is possible to further improve the mechanical strength of the piezoelectric-side terminal 40 and thereby further improve the reliability of the connection between the piezoelectric-side terminal 40 and the piezoelectric terminal 34.

Also, in the embodiment of FIG. 4, both the insulating base layer 28 and the insulating cover layer 29 are formed. However, as shown in, e.g., FIG. 16, the outer contact portion 51 can also be formed to protrude above the inner contact portion 53 without forming either the insulating base layer 28 or the insulating cover layer 29.

Also, in the same manner as in the embodiment of FIG. 14, when the conductive adhesive 42 is injected over the upper surface of the piezoelectric-side terminal 40, it is possible to inhibit the conductive adhesive 42 from leaking out using the outer contact portion 51 and electrically connect the upper surface of the piezoelectric-side terminal 40 to the piezoelectric terminal 34.

In the embodiment of FIG. 16, not only the same function and effect as achieved in the embodiment of FIG. 4 are achieved, but also the insulating base layer 28 and the insulating cover layer 29 need not be additionally provided and the upper surface of the piezoelectric-side terminal 40 can be electrically connected to the piezoelectric terminal 34. Therefore, compared to the embodiment of FIG. 14, a further reduction can be achieved in the number of the components.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A wired circuit board, comprising:
a wire; and
an electronic element-side terminal formed continuously to the wire and electrically connected to an electronic element at one surface formed on one side of the electronic element-side terminal in a thickness direction of the wired circuit board, wherein
the electronic element-side terminal includes:
an inner contact portion; and
an outer contact portion which surrounds the inner contact portion and which is outwardly spaced apart therefrom, the outer contact portion being provided continuously to the wire via an outer conductive portion, and the outer contact portion being provided continuously to an entire outer peripheral portion of the inner contact portion via an inner conductive portion, wherein the outer contact portion protrudes more than the inner contact portion toward the one side of the electronic element-side terminal in the thickness direction.

2. The wired circuit board according to claim 1, wherein electronic element-side the terminal is used to be connected to the electronic element via a conductive adhesive.

3. The wired circuit board according to claim 1, further comprising:
a first insulating layer formed on the one side of the electronic element-side terminal in the thickness direction, wherein
the first insulating layer is formed with a first opening exposing the one surface of each of the inner contact portion and the outer contact portion in the thickness direction.

4. The wired circuit board according to claim 3, wherein the outer contact portion protrudes from the one surface of the first insulating layer in the thickness direction toward the one side in the thickness direction.

5. The wired circuit board according to claim 1, further comprising:
a second insulating layer formed on an opposite side of the electronic element-side terminal in the thickness direction, wherein
the second insulating layer is formed with a second opening exposing an opposite surface of each of the inner contact portion and the outer contact portion in the thickness direction.

6. The wired circuit board according to claim 1, wherein the electronic element is a piezoelectric element.

* * * * *